(12) United States Patent
Face et al.

(10) Patent No.: US 7,084,529 B2
(45) Date of Patent: Aug. 1, 2006

(54) SELF-POWERED SWITCH INITIATION SYSTEM

(75) Inventors: Bradbury R Face, Norfolk, VA (US); Clark Davis Boyd, Radford, VA (US); Glenn F. Rogers, Jr., Hampton, VA (US); Gregory P. Thomas, Virginia Beach, VA (US)

(73) Assignee: Face International Corp., Norfolk, VA (US)

( * ) Notice: Subject to any disclaimer, the term of this patent is extended or adjusted under 35 U.S.C. 154(b) by 505 days.

(21) Appl. No.: 10/188,633

(22) Filed: Jul. 3, 2002

(65) Prior Publication Data

US 2003/0193417 A1    Oct. 16, 2003

Related U.S. Application Data

(60) Provisional application No. 60/302,990, filed on Jul. 3, 2001.

(51) Int. Cl.
  H10H 35/00 (2006.01)
  H10H 83/00 (2006.01)
(52) U.S. Cl. .................. 307/116; 307/119; 310/311; 310/318

(58) Field of Classification Search .............. 341/34; 307/116, 117; 310/311, 314, 318, 339
See application file for complete search history.

(56) References Cited

U.S. PATENT DOCUMENTS

| | | | | |
|---|---|---|---|---|
| 4,257,010 | A * | 3/1981 | Bergman et al. | 331/65 |
| 4,521,712 | A * | 6/1985 | Braun et al. | 310/339 |
| 6,630,894 | B1 * | 10/2003 | Boyd et al. | 341/22 |
| 6,700,310 | B1 * | 3/2004 | Maue et al. | 310/339 |
| 6,812,594 | B1 * | 11/2004 | Face et al. | 307/119 |
| 2003/0094856 | A1 * | 5/2003 | Face et al. | 307/116 |
| 2004/0174073 | A9 * | 9/2004 | Face et al. | 307/116 |
| 2005/0087019 | A1 * | 4/2005 | Face | 73/649 |

* cited by examiner

Primary Examiner—Timothy Edwards, Jr.
(74) Attorney, Agent, or Firm—Davod J. Bolduc

(57) ABSTRACT

A self-powered switching device using a prestressed flextensional electroactive member generates a signal for activation of a latching relay. The electroactive member has a piezoelectric element with a convex and a concave face that may be compressed to generate an electrical pulse. The flextensional electroactive member and associated signal generation circuitry can be hardwired directly to the latching relay or may be coupled to a transmitter for sending an RF signal to a receiver which actuates the latching relay.

59 Claims, 9 Drawing Sheets

$V_{out}$ $V_{rect}$ $V_{reg}$

SELF-POWERED SWITCH INITIATION SYSTEM

This application claims priority from provisional application No. 60/302,990 filed Jul. 3, 2001.

BACKGROUND OF THE INVENTION

1. Field of the Invention

The present invention relates generally to switching devices for energizing lights, appliances and the like. More particularly, the present invention relates to a self-powered switch initiator device to generate an activation signal for a latching relay. The power is generated through a piezoelectric element and is sent through signal generation circuitry coupled to a transmitter for sending RF signal (which may be unique and/or coded) to one or more receivers that actuate the latching relay. The receivers are also trainable to respond to multiple transmitters.

2. Description of the Prior Art

Switches and latching relays for energizing lights, appliances and the like are well known in the prior art. Typical light switches comprise, for example, single-pole switches and three-way switches. A single-pole switch has two terminals that are hot leads for an incoming line (power source) and an outgoing line to the light. Three-way switches can control one light from two different places. Each three-way switch has three terminals: the common terminal and two traveler terminals. A typical pair of three-way switches uses two boxes each having two cables with the first box having an incoming line from a power source and an outbound line to the second box, and the second box having the incoming line from the first box and an outbound line to the light.

In each of these switching schemes it is often necessary to drill holes and mount switches and junction boxes for the outlets as well as running cable. Drilling holes and mounting switches and junction boxes can be difficult and time consuming. Also, running electrical cable requires starting at a fixture, pulling cable through holes in the framing to each fixture in the circuit, and continuing all the way back to the service panel. Though simple in theory, getting cable to cooperate can be difficult and time consuming. Cable often kinks, tangles or binds while pulling, and needs to be straightened out somewhere along the run.

Remotely actuated switches/relays are also known in the art. Known remote actuation controllers include tabletop controllers, wireless remotes, timers, motion detectors, voice activated controllers, and computers and related software. For example, remote actuation means may include modules that are plugged into a wall outlet and into which a power cord for a device may be plugged. The device can then be turned on and off by a controller. Other remote actuation means include screw-in lamp modules wherein the module is screwed into a light socket, and then a bulb screwed into the module. The light can be turned on and off and can be dimmed or brightened by a controller.

An example of a typical remote controller for the above described modules is a radio frequency (RF) base transceiver. With these controllers, a base is plugged into an outlet and can control groups of modules in conjunction with a hand held wireless RF remote. RF repeaters may be used to boost the range of compatible wireless remotes, switches and security system sensors by up to 150 ft. per repeater. The base is required for all wireless RF remotes and allows control of several lamps or appliances. Batteries are also required in the hand held wireless remote.

Rather than using a hand held RF remote, remote wall switches may be used. These wall switches, which are up to ¾" thick, are affixed to a desired location with an adhesive. In conjunction with a base unit (plugged into a 110V receptacle) the remote wall switch may control compatible modules or switches (receivers). The wireless switches send an RF signal to the base unit and the base unit then transmits a signal along the existing 110V wiring in the home to compatible switches or modules. Each switch can be set with an addressable signal. Wireless switches also require batteries.

These remotes control devices may also control, for example, audio/video devices such as the TV, VCR, and stereo system, as well as lights and other devices using an RF to infrared (IR) base. The RF remote can control audio/video devices by sending proprietary RF commands to a converter that translates the commands to IR. IR commands are then sent to the audio/video equipment. The console responds to infrared signals from the infrared remotes and then transmits equivalent commands to compatible receivers.

A problem with conventional wall switches is that extensive wiring must be run both from the switch boxes to the lights and from the switch boxes to the power source in the service panels.

Another problem with conventional wall switches is that additional wiring must be run for lights controlled by more than one switch.

Another problem with conventional wall switches is that the high voltage lines are present as an input to and an output from the switch.

Another problem with conventional wall switches is the cost associated with initial installation of wire to, from and between switches.

Another problem with conventional wall switches is the cost and inconvenience associated with remodeling, relocating or rewiring existing switches.

A problem with conventional RF switches is that they require an external power source such as high voltage AC power or batteries.

Another problem with conventional RF switches is the cost and inconvenience associated with replacement of batteries.

Another problem with conventional RF switches is that they require high power to individual modules and base units.

Another problem with conventional AC-powered RF switches is the difficulty when remodeling in rewiring or relocating a wall switch.

Another problem with conventional RF switches is that a pair comprising a transmitter and receiver must generally be purchased together.

Another problem with conventional RF switches is that transmitters may inadvertently activate incorrect receivers.

Another problem with conventional RF switches is that receivers may accept an activation signal from only one transmitter.

Another problem with conventional RF switches is that transmitters may activate only one receiver.

Accordingly, it would be desirable to provide a network of switch initiators and/or latching relay devices that overcomes the aforementioned problems of the prior art.

SUMMARY OF THE INVENTION

The present invention provides a self-powered switching initiator or latching relay device using an electroactive or electromagnetic actuator. The piezoelectric element in the electroactive actuator is capable of deforming with a high amount of axial displacement, and when deformed by a mechanical impulse generates an electric field. In an electromagnetic device, the relative motion between a magnet and a series of coils develops the electrical signal. The electroactive actuator is used as an electromechanical generator for generating a momentary signal that initiates a latching or relay mechanism. The latching or relay mechanism thereby turns electrical devices such as lights and appliances on and off or provides an intermediate or dimming signal.

The mechanical actuating means for the electroactive actuator element applies a suitable mechanical impulse to the electroactive actuator element in order to generate an electrical signal, such as a pulse or wave having sufficient magnitude and duration to actuate downstream circuit components. A switch similar to a light switch, for example, may apply pressure through a toggle, snap action, paddled or plunger mechanism. Larger or multiple electroactive actuator elements may also be used to generate the electrical signal. Copending application Ser. No. 09/616,978 entitled "Self-Powered Switching Device," which is hereby incorporated by reference, discloses a self-powered switch where the electroactive element generates an electrical pulse. Copending provisional application 60/252,228 entitled "Self-Powered Trainable Switching Network," which is hereby incorporated by reference, discloses a network of switches such as that disclosed in the application 09/616,978, with the modification that the switches and receivers are capable accepting a multiplicity of coded RF signals. In the present invention, a modification has been developed to the mechanical actuation of the electroactive element resulting in a modification of the type of electrical signal produced by the actuator. The present invention describes a self-powered switch initiator having an electroactive element and accompanying circuitry designed to work with an oscillating electrical signal. To harness the power generated by the electroactive element, the accompanying RF signal generation circuitry has also been modified to use the electrical signal most efficiently.

In one embodiment of the invention, the electroactive actuator is depressed by the manual or mechanical actuating means and the oscillating electrical signal generated by the electroactive actuator is applied to the relay or switch through circuitry designed to modify the electrical signal. In yet another embodiment, the electromagnetic or electroactive actuator signal powers an RF transmitter which sends an RF signal to an RF receiver which then actuates the relay. In yet another embodiment, the electromagnetic or electroactive actuator signal powers a transmitter, which sends a pulsed RF signal to an RF receiver which then actuates the relay. Digitized RF signals may be coded (as with a garage door opener) to only activate the relay that is coded with that digitized RF signal. The transmitters may be capable of developing one or more coded RF signals and the receivers likewise may be capable of receiving one or more coded RF signal. Furthermore, the receivers may be "trainable" to accept coded RF signals from new or multiple transmitters.

Accordingly, it is a primary object of the present invention to provide a switching or relay device in which an electroactive or piezoelectric element is used to activate the device.

It is another object of the present invention to provide a device of the character described in which switches may be installed without necessitating additional wiring.

It is another object of the present invention to provide a device of the character described in which switches may be installed without cutting holes into the building structure.

It is another object of the present invention to provide a device of the character described in which switches do not require external electrical input such as 120 or 220 VAC or batteries.

It is another object of the present invention to provide a device of the character described incorporating an electroactive device that generates an electrical signal of sufficient magnitude and duration to activate a latching relay and/or switch initiator.

It is another object of the present invention to provide a device of the character described incorporating an electroactive that generates an electrical signal of sufficient duration and magnitude to activate a radio frequency transmitter for activating a latching relay and/or switch initiator.

It is another object of the present invention to provide a device of the character described incorporating an actuator that generates an electrical signal of sufficient magnitude to activate a radio frequency transmitter for activating a latching relay and/or switch initiator.

It is another object of the present invention to provide a device of the character described incorporating a transmitter that is capable of developing at least one coded RF signal.

It is another object of the present invention to provide a device of the character described incorporating a receiver capable of receiving at least one coded RF signal from at least one transmitter.

It is another object of the present invention to provide a device of the character described incorporating a receiver capable of "learning" to accept coded RF signals from one or more transmitters.

It is another object of the present invention to provide a device of the character described for use in actuating lighting, appliances, security devices and other fixtures in a building.

Further objects and advantages of the invention will become apparent from a consideration of the drawings and ensuing description thereof.

DESCRIPTION OF THE PREFERRED EMBODIMENT

Electroactive Actuator

Figure 1:
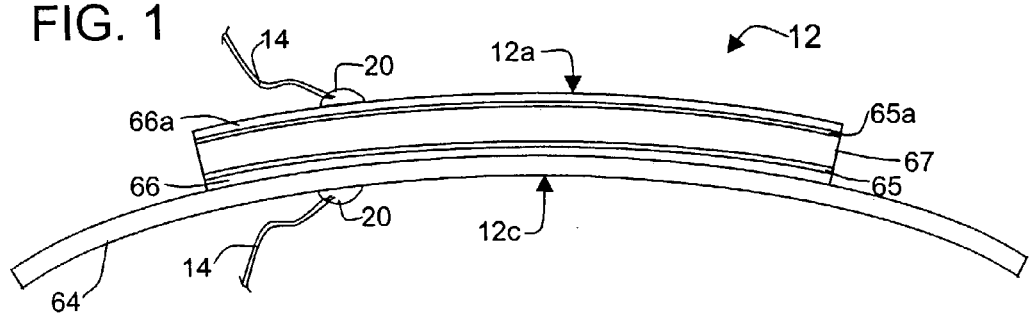
FIG. 1 is an elevation view showing the details of construction of a flextensional piezoelectric actuator used in the present invention.

Piezoelectric and electrostrictive materials (generally called "electroactive" devices herein) develop a polarized electric field when placed under stress or strain. The electric field developed by a piezoelectric or electrostrictive material is a function of the applied force causing the mechanical stress or strain. Conversely, electroactive devices undergo dimensional changes in an applied electric field. The dimensional change (i.e., expansion or contraction) of an electroactive device is a function of the applied electric field. Electroactive devices are commonly used as drivers, or "actuators" due to their propensity to deform under such electric fields. These electroactive devices or actuators also have varying capacities to generate an electric field in response to a deformation caused by an applied force.

Electroactive devices include direct and indirect mode actuators, which typically make use of a change in the dimensions of the material to achieve a displacement, but in the present invention are preferably used as electromechanical generators. Direct mode actuators typically include a piezoelectric or electrostrictive ceramic plate (or stack of plates) sandwiched between a pair of electrodes formed on its major surfaces. The devices generally have a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent. Conversely, direct mode generator-actuators require application of a high amount of force to piezoelectrically generate a pulsed momentary electrical signal of sufficient magnitude to activate a latching relay.

Indirect mode actuators are known to exhibit greater displacement and strain than is achievable with direct mode actuators by achieving strain amplification via external structures. An example of an indirect mode actuator is a flextensional transducer. Flextensional transducers are composite structures composed of a piezoelectric ceramic 32 element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater strain and displacement than can be produced by direct mode actuators.

The magnitude of achievable strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10%. A conventional bimorph device includes an intermediate flexible metal foil sandwiched between two piezoelectric elements. Electrodes are bonded to each of the major surface of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20%.

For certain applications of electroactive actuators, asymmetrically stress biased electroactive devices have been proposed in order to increase the axial deformation of the electroactive material, and therefore increase the achievable strain of the electroactive material. In such devices, (which include, for example, "Rainbow" actuators (as disclosed in U.S. Pat. No. 5,471,721), and other flextensional actuators) the asymmetric stress biasing produces a curved structure, typically having two major surfaces, one of which is concave and the other which is convex.

Referring to FIG. 1: A unimorph actuator called "THUNDER", which has improved displacement, strain and load capabilities, has recently been developed and is disclosed in U.S. Pat. No. 5,632,841. THUNDER (which is an acronym for THin layer composite UNimorph ferroelectric Driver and sEnsoR), is a unimorph actuator in which a pre-stress layer is bonded to a thin piezoelectric ceramic wafer at high temperature, and during the cooling down of the composite structure asymmetrically stress biases the ceramic wafer due to the difference in thermal contraction rates of the pre-stress layer and the ceramic layer.

The THUNDER actuator 12 is as a composite structure, the construction of which is illustrated in FIG. 1. Each THUNDER actuator 12 is constructed with an electroactive member preferably comprising a piezoelectric ceramic layer 67 of PZT which is electroplated 65 and 65a on its two opposing faces. A pre-stress layer 64, preferably comprising spring steel, stainless steel, beryllium alloy or other metal substrate, is adhered to the electroplated 65 surface on one side of the ceramic layer 67 by a first adhesive layer 66. In the simplest embodiment, the adhesive layer 66 acts as a prestress layer. The first adhesive layer 66 is preferably LaRC™-SI material, as developed by NASA-Langley Research Center and disclosed in U.S. Pat. No. 5,639,850. A second adhesive layer 66a, also preferably comprising LaRC-SI material, is adhered to the opposite side of the ceramic layer 67. During manufacture of the THUNDER actuator 12 the ceramic layer 67, the adhesive layer(s) 66 and 66a and the pre-stress layer 64 are simultaneously heated to a temperature above the melting point of the adhesive material. In practice the various layers composing the THUNDER actuator (namely the ceramic layer 67, the adhesive layers 66 and 66a and the pre-stress layer 64) are typically placed inside of an autoclave or a convection oven as a composite structure, and slowly heated by convection until all the layers of the structure reach a temperature which is above the melting point of the adhesive 66 material but below the Curie temperature of the ceramic layer 67. It is desirable to keep the temperature of the ceramic layer 67 beneath the Curie temperature of the ceramic layer in order to avoid disrupting the piezoelectric characteristics of the ceramic layer 67. Because the multi-layer structure is typically convectively heated at a slow rate, all of the layers tend to be at approximately the same temperature. In any event, because an adhesive layer 66 is typically located between two other layers (i.e. between the ceramic layer 67 and the pre-stress layer 64), the ceramic layer 67 and the pre-stress layer 64 are usually very close to the same temperature and are at least as hot as the adhesive layers 66 and 66a during the heating step of the process. The THUNDER actuator 12 is then allowed to cool.

During the cooling step of the process (i.e. after the adhesive layers 66 and 66a have re-solidified) the ceramic layer 67 becomes compressively stressed by the adhesive layers 66 and 66a and pre-stress layer 64 due to the higher coefficient of thermal contraction of the materials of the adhesive layers 66 and 66a and the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66a) on the other side of the ceramic layer 67, the ceramic layer deforms in an arcuate shape having a normally convex face 12a and a normally concave face 12c, as illustrated in FIGS. 1 and 2.

Figure 1A:
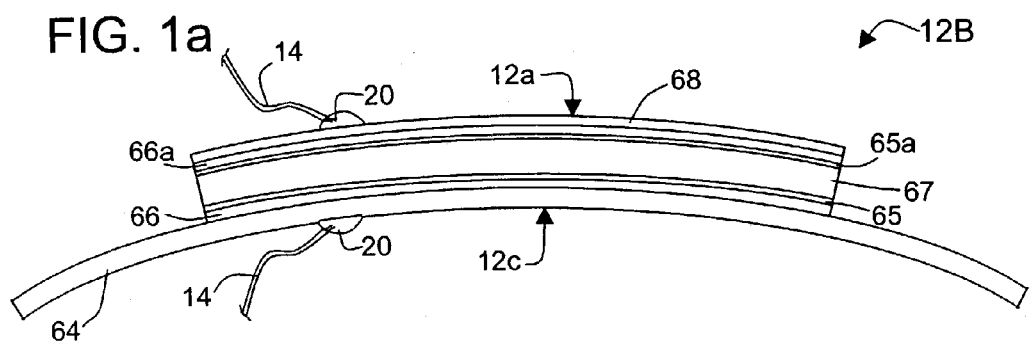
FIG. 1a is an elevation view showing the details of construction of the flextensional piezoelectric actuator of FIG. 1 having an additional prestress layer.

Referring to FIG. 1a: One or more additional pre-stressing layer(s) may be similarly adhered to either or both sides of the ceramic layer 67 in order, for example, to increase the stress in the ceramic layer 67 or to strengthen the actuator 12B. In a preferred embodiment of the invention, a second prestress layer 68 is placed on the concave face 12a of the actuator 12B having the second adhesive layer 66a and is similarly heated and cooled. Preferably the second prestress layer 68 comprises a layer of conductive metal. More preferably the second prestress layer 68 comprises a thin foil (relatively thinner than the first prestress layer 64) comprising aluminum or other conductive metal. During the cooling step of the process (i.e. after the adhesive layers 66 and 66a have re-solidified) the ceramic layer 67 similarly becomes compressively stressed by the adhesive layers 66 and 66a and pre-stress layers 64 and 68 due to the higher coefficient of thermal contraction of the materials of the adhesive layers 66 and 66a and the pre-stress layers 64 and 68 than for the material of the ceramic layer 67. Also, due to the greater thermal contraction of the laminate materials (e.g. the first prestress layer 64 and the first adhesive layer 66) on one side of the ceramic layer 67 relative to the thermal contraction of the laminate material(s) (e.g. the second adhesive layer 66a and the second prestress layer 68) on the other side of the ceramic layer 67, the ceramic layer 67 deforms into an arcuate shape having a normally convex face 12a and a normally concave face 12c, as illustrated in FIG. 1a.

Alternatively, the substrate comprising a separate pre-stress layer 64 may be eliminated and the adhesive layers 66 and 66a alone or in conjunction may apply the prestress to the ceramic layer 67. Alternatively, only the prestress layer(s) 64 and 68 and the adhesive layer(s) 66 and 66a may be heated and bonded to a ceramic layer 67, while the ceramic layer 67 is at a lower temperature, in order to induce greater compressive stress into the ceramic layer 67 when cooling the actuator 12.

Figure 2:
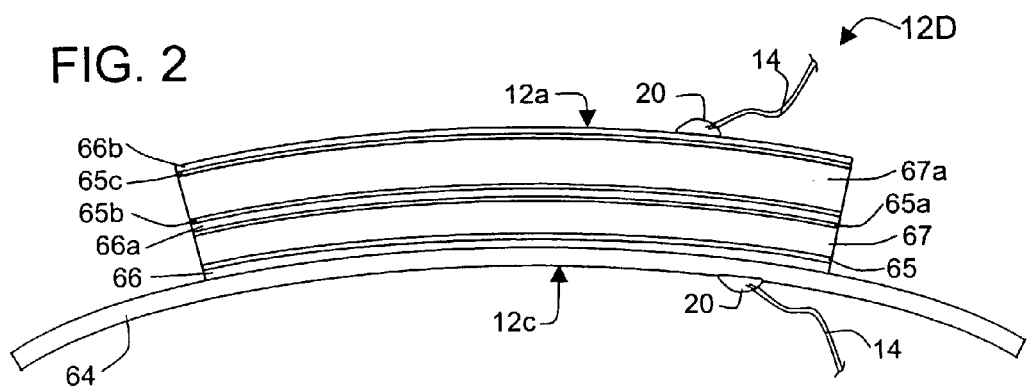
FIG. 2 is an elevation view showing the details of construction of an alternate multi-layer flextensional piezoelectric actuator used in a modification the present invention.

Referring now to FIG. 2: Yet another alternate actuator 12D includes a composite piezoelectric ceramic layer 69 that comprises multiple thin layers 69a and 69b of PZT which are bonded to each other. Each layer 69a and 69b comprises a thin layer of piezoelectric material, with a thickness preferably on the order of about 1 mil. Each thin layer 69a and 69b is electroplated 65 and 65a, and 65b and 65c on each major face respectively. The individual layers 69a and 69b are then bonded to each other with an adhesive layer 66b, using an adhesive such as LaRC-SI. Alternatively, and most preferably, the thin layers 69a and 69b may be bonded to each other by cofiring the thin sheets of piezoelectric material together. As few as two layers 69a and 69b, but preferably at least four thin sheets of piezoelectric material may be bonded/cofired together. The composite piezoelectric ceramic layer 69 may then be bonded to prestress layer(s) 64 with the adhesive layer(s) 66 and 66a, and heated and cooled as described above to make a modified THUNDER actuator 12D. By having multiple thinner layers 69a and 69b of piezoelectric material in a modified actuator 12D, the composite ceramic layer generates a lower voltage and higher current as compared to the high voltage and low current generated by a THUNDER actuator 12 having only a single thicker ceramic layer 67.

A flexible insulator may be used to coat the convex face 12a of the actuator 12. This insulative coating helps prevent unintentional discharge of the piezoelectric element through inadvertent contact with another conductor, liquid or human contact. The coating also makes the ceramic element more durable and resistant to cracking or damage from impact. Since LaRC-SI is a dielectric, the adhesive layer 67a on the convex face 12a of the actuator 12 may act as the insulative layer. Alternately, the insulative layer may comprise a plastic, TEFLON or other durable coating.

Electrical energy may be recovered from or introduced to the actuator element 12 by a pair of electrical wires 14. Each electrical wire 14 is attached at one end to opposite sides of the actuator element 12. The wires 14 may be connected (for example by glue or solder 20) directly to the electroplated 65 and 65a faces of the ceramic layer 67, or they may alternatively be connected to the pre-stress layer(s) 64. As discussed above, the prestress layer 64 is preferably adhered to the ceramic layer 67 by LaRC-SI material, which is a dielectric. When the wires 14 are connected to the pre-stress layer(s) 64, it is desirable to roughen a face of the pre-stress layer 64, so that the pre-stress layer 64 intermittently penetrates the respective adhesive layers 66 and 66a, and make electrical contact with the respective electroplated 65 and 65a faces of the ceramic layer 67. Alternatively, the Larc-SI adhesive layer 66 may have a conductive material, such as Nickel or aluminum particles, used as a filler in the adhesive and to maintain electrical contact between the prestress layer and the electroplated face of the ceramic. The opposite end of each electrical wire 14 is preferably connected to an electric pulse modification circuit 10.

Prestressed flextensional transducers 12 are desirable due to their durability and their relatively large displacement, and concomitant relatively high voltage that such transducers are capable of developing. The present invention however may be practiced with any electroactive element having the properties and characteristics herein described, i.e., the ability to generate a voltage in response to a deformation of the device. For example, the invention may be practiced using magnetostrictive or ferroelectric devices. The transducers also need not be normally arcuate, but may also include transducers that are normally flat, and may further include stacked piezoelectric elements.

Figure 4:
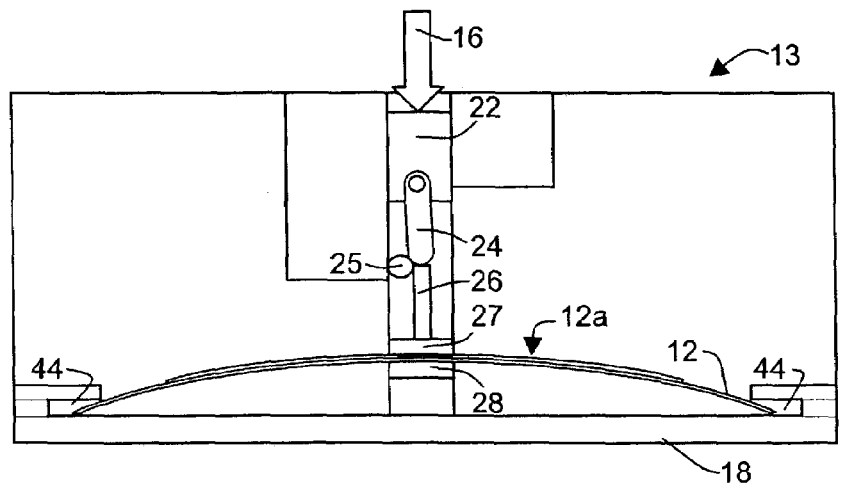
FIG. 4 is an elevation view of the device of FIG. 3 illustrating the deformation of the actuator upon application of a force.

In operation, as shown in FIG. 4, when a force indicated by arrow 16 is applied to the convex face 12a of the actuator 12, the force deforms the piezoelectric element 67. The force may be applied to the piezoelectric actuator 12 by any appropriate means such as by application of manual pressure directly to the piezoelectric actuator, or by other mechanical means. Preferably, the force is applied by a mechanical switch (e.g., a plunger, striker, toggle or roller switch) capable of developing a mechanical impulse for application to and removal from the actuator 12. The mechanical impulse (or removal thereof) is of sufficient force to cause the actuator 12 to deform quickly and accelerate over a distance (approximately 10 mm) which generates an electrical signal of sufficient magnitude to activate an electromechanical latching relay.

Figure 3:
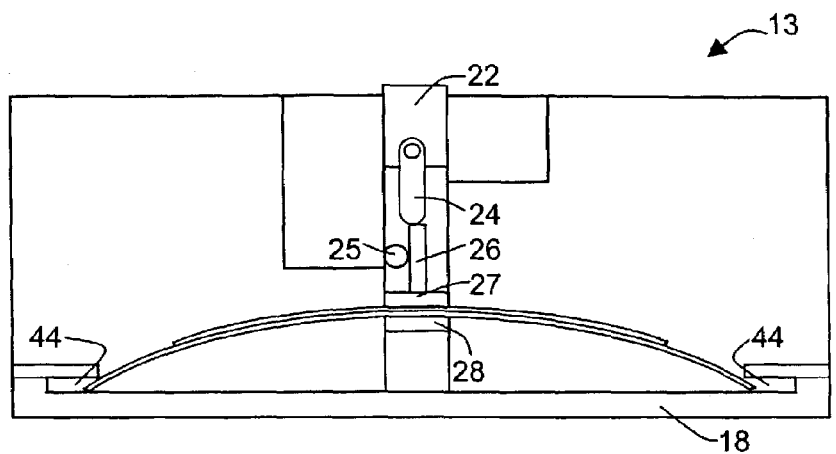
FIG. 3 is an elevation view of an embodiment of a device for mechanical application and removal of a force to the center of an actuator.
Figure 5:
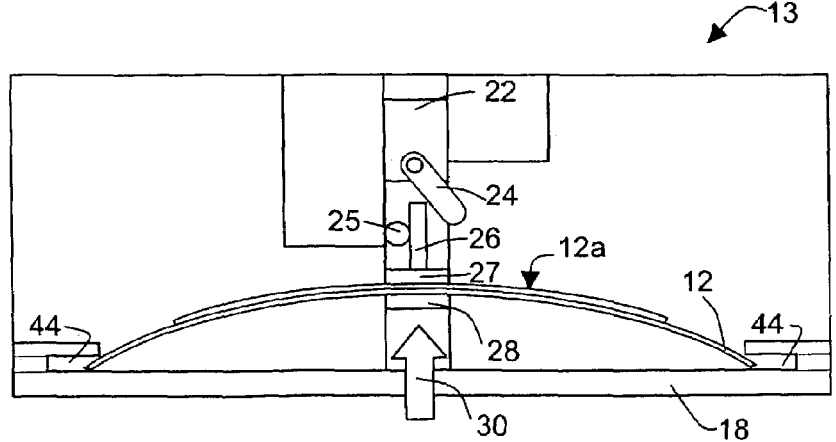
FIG. 5 is an elevation view of the device of FIG. 3 illustrating the recovery of the actuator upon removal of the force by tripping of a quick-release device.

Referring to FIGS. 3, 4 and 5: An illustration of prior means generating an electrical pulse by application of mechanical force comprises a switch plate 18 and a plunger assembly 13. The two ends of the piezoelectric actuator are each pivotably held in place within a recess 44 of a switch plate 18. The switch plate 18 is the same shape as the actuator 12 contained therein, preferably rectangular. Alternatively, a circular actuator is mounted in a circular recess of a circular switch plate. The recess(es) 44 in the switch plate 18 hold the actuator 12 in place in its relaxed, i.e., undeformed state. The recesses 44 are also sufficiently deep to fully receive the ends or edges of the actuator 12 in its fully deformed, i.e., flat state. The plunger assembly comprises a push button 22 pivotably connected to a hinged quick-release mechanism 24. The opposite end of the quick-release mechanism 24 contacts shaft 26 connected to a pair of plates 27 and 28 which are clamped on both sides of the actuator 12. A release cog 25 is located along the path of the quick-release mechanism 24.

In operation, when the push button 22 is depressed in the direction of arrow 16, the quick-release mechanism 24 pushes down on the shaft 26 and plates 27 and 28 and deforms the actuator 12. When the quick-release mechanism 24 reaches the release cog 25, the quick-release mechanism 24 pivots on its hinge and releases the downward pressure from the shaft 26, plates 27 and 28 and actuator 12. The actuator 12, on account of the restoring force of the substrate of the prestress layer 64, returns quickly to its undeformed state in the direction of arrow 30 as in FIG. 5.

As previously mentioned, the applied force causes the piezoelectric actuator 12 to deform. By virtue of the piezoelectric effect, the deformation of the piezoelectric element 67 generates an instantaneous voltage between the faces 12a and 12c of the actuator 12, which produces a pulse of electrical energy. Furthermore, when the force is removed from the piezoelectric actuator 12, the actuator 12 recovers its original arcuate shape. This is because the substrate or prestress layers 64 and 68 to which the ceramic 67 is bonded exert a compressive force on the ceramic 67, and the actuator 12 thus has a coefficient of elasticity that causes the actuator 12 to return to its undeformed neutral state. On the recovery stroke of the actuator 12, the ceramic 67 returns to its undeformed state and thereby produces another electrical pulse of opposite polarity. The downward (applied) or upward (recovery) strokes should cause a force over a distance that is of sufficient magnitude to create the desired electrical pulse. The duration of the recovery stroke, and therefore the duration of the pulse produced, is preferably in the range of 50–100 milliseconds, depending on the amount of force applied to the actuator 12.

Figure 6:
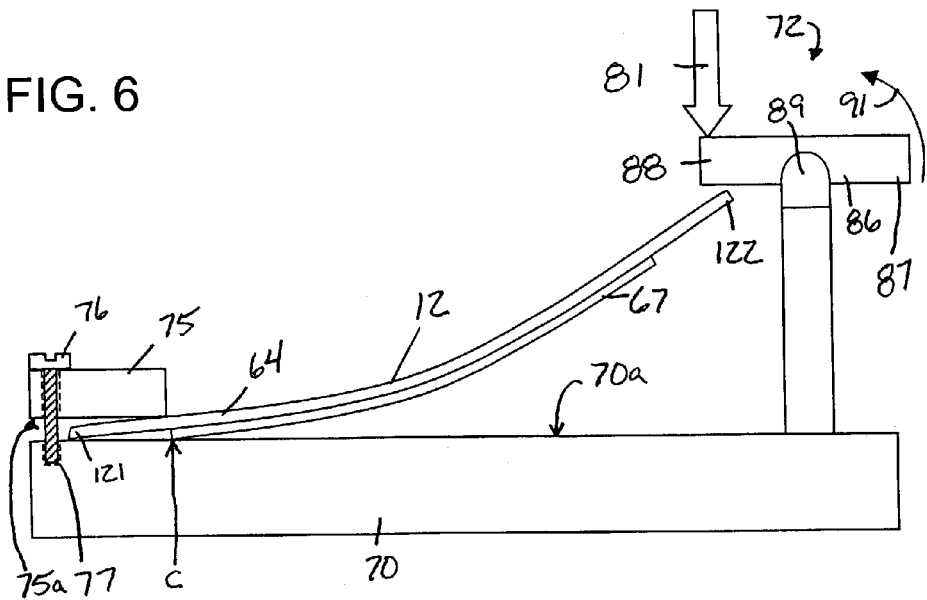
FIG. 6 is an elevation view of the actuating device of the present invention for generation of an electrical signal by deflecting a flextensional piezoelectric actuator.

Referring to FIG. 6.: In the preferred embodiment of the invention, the actuator 12 is clamped at one end 121 and the mechanical impulse is applied to the edge on the free end 122, i.e., at the end opposite to the clamped end 121 of the actuator 12. By applying the force to the edge on the free end 122 of the actuator 12 and releasing it, the electrical pulse that is generated upon removal of the force is an oscillating wave rather than a single pulse as in the prior actuating means disclosed above.

Referring again to FIG. 6: FIG. 6 illustrates one embodiment of a device for generating an electrical pulse by application of mechanical force to an end of the actuator 12. This device comprises an actuator 12 mounted between a base plate 70 and a clamping member 75 as well as a deflector assembly 72. The base plate 70 is preferably of substantially the same shape (in plan view) as the actuator 12 attached thereon, and most preferably rectangular. One end 121 of the piezoelectric actuator 12 is held in place between the clamping member 75 and the upper surface 70a of a base plate 70, preferably on one end thereof. The clamping member 75 comprises a plate or block having a lower surface 75a designed to mate with the upper surface 70a of the base plate 70 with the actuator 12 therebetween. The device also has means for urging 76 the mating surface 75a of the clamping block towards the upper surface 70a of the base plate 70. This allows the lower surface 75a of the clamping plate 75 to be substantially rigidly coupled to the upper surface 70a of the base plate 70, preferably towards one side of the switch plate 70. The means for urging 76 together the mating surfaces 70a and 75a of the base plate 70 and clamping plate 75 may comprise screws, clamping jaws or springs or the like. Most preferably the urging means 76 comprises at least one screw 76 passing through the clamping member 75 and into a screw hole 77 in the upper surface 70a of the base plate 70.

One end 121 of an actuator 12 is placed between the mating surfaces 70a and 75a of the base and clamping plates 70 and 75. The mating surfaces 70a and 75a are then urged towards each other with the screw 76 to rigidly hold the end 121 of the actuator 12 in place between the base and clamping plates 70 and 75 with the opposite end 122 of the actuator 12 free to be moved by a mechanical impulse applied manually or preferably by a deflector assembly 72.

Figure 7:
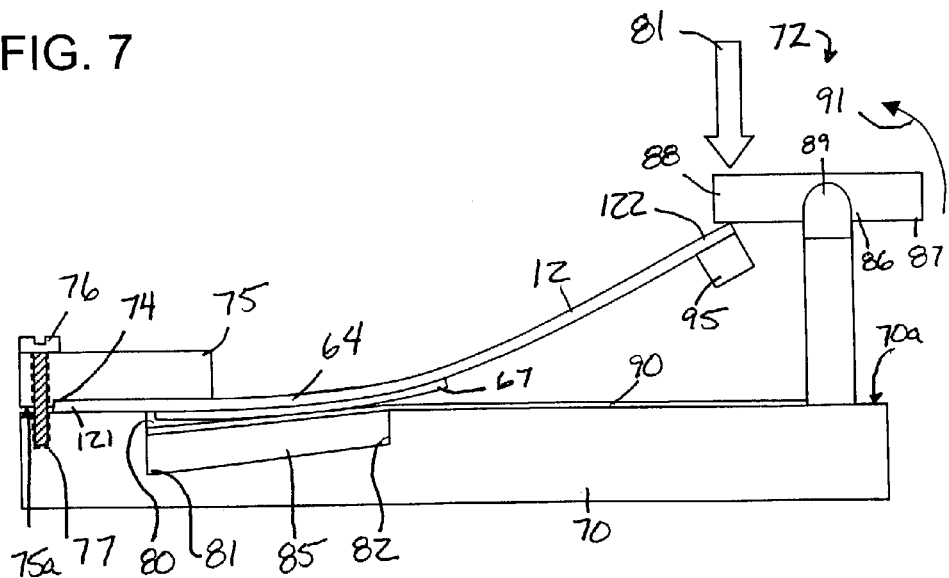
FIG. 7 is an elevation view of the preferred actuating device of the present invention for generation of an electrical signal by deflecting a flextensional piezoelectric actuator.

Referring now to FIG. 7: In the preferred embodiment of the invention the surfaces 70a and 75a of the base and clamping plate 70 and 75 are designed to best distribute pressure evenly along the end 121 of the actuator therebetween. To this end the upper surface 70a of the base plate 70 contacting the end 121 of the actuator is preferably substantially flat and lower surface 75a of the clamping member 75 preferably has a recess 74 therein which accommodates insertion of the actuator end 121 therein. Preferably the depth of the recess 74 is equal to half the thickness of the actuator substrate 64, but may be as deep as the substrate thickness. Thus, the end 121 of the actuator 12 may be placed between the recess 74 and the upper surface 70a of the base plate 70 and secured therebetween by the screw 76. Alternatively, either or both of the mating surfaces 70a and 75a of the base and clamping plates 70 and 75 may have a recess therein to accommodate insertion and retention of the end 121 of the actuator 12 therebetween. The portion of the bottom surface 75a of the clamping member 75 beyond the recess 74 has no contact with the actuator 12, and is that portion through which the screw 76 passes. This portion of the bottom surface 75a may contact the upper surface 70a of the base plate 70, but most preferably there is a small gap (equal to the difference of the substrate thickness and the recess depth) between the lower surface 75a of the clamping member 75 and the top surface 70a of the base plate 70 when the actuator 12 is inserted therebetween. In yet another embodiment of the invention, the mating surfaces 70a and 75a of the base and clamping plates 70 and 75 may be adhesively bonded together (rather than screwed) with the end 121 of the actuator 12 sandwiched therebetween. In yet another alternative embodiment of the device, the clamping member 75 and base plate 70 may comprise a single molded structure having a central slot into which may be inserted one end 121 of the actuator 12.

The clamping assembly 75 holds the actuator 12 in place in its relaxed, i.e., undeformed state above the base plate 70 with the free end 122 of the actuator 12 in close proximity to a deflector 72 assembly. More specifically, the actuator 12 is preferably clamped between the mating surfaces 70a and 75a of the base and clamping plates 70 and 75 with the convex face 12a of the actuator 12 facing the base plate 70. Since the actuator 12 in its relaxed state is arcuate, the convex face 12a of the actuator 12 curves away from the upper surface 70a of the base plate 70 while approaching the free end 122 of the actuator 12. Mechanical force may then be applied to the free end 122 of the actuator 12 in order to deform the electroactive element 67 to develop an electrical signal.

Because of the composite, multi-layer construction of the actuator 12 it is important to ensure that the clamping member 75 not only holds the actuator 12 rigidly in place, but also that the actuator 12 is not damaged by the clamping member 75. In other words, the actuator 12, and more specifically the ceramic layer 67, should not be damaged by the clamping action of the clamping member 75 in a static mode, but especially in the dynamic state when applying a mechanical impulse to the actuator 12 with the plunger 72. For example, referring to FIG. 6, when a mechanical impulse is applied to the actuator 12 in the direction of arrow 81, the bottom corner of the ceramic (at point C) contacts the base plate 70 and is further pushed into the base plate, which may crack or otherwise damage the ceramic layer 67.

Referring again to FIG. 7: It has been found that the tolerances between the mating surfaces 75a and 70a of the clamping and base plates 75 and 70 are very narrow. It has also been found that application of a downward force (as indicated by arrow 81) to the free end 122 of the actuator 12 would cause the ceramic element 67 of the actuator 12 to contact the upper surface 70a of the base plate 70, thereby making more likely damage to the ceramic 67. Therefore, in the preferred embodiment of the invention, the switch plate 70 has a recessed area 80 in its upper surface 70a which not only protects the electroactive element 67 from damage but also provides electrical contact to the convex face 12a of the actuator 12 so that the electrical signal developed by the actuator 12 may be applied to downstream circuit elements.

As can be seen in FIG. 7, one end 121 of the actuator is placed between the surfaces 75a and 70a of the clamping and base plates 75 and 70 such that only the substrate 64 contacts both surface 75a and 70a. The clamping plate 75 preferably contacts the concave surface 12b of the actuator 12 along the substrate 64 up to approximately the edge of the ceramic layer 67 on the opposite face 12a of the actuator 12. The clamping member may however extend along the convex face 12c further than the edge C of the ceramic layer 67 in order to apply greater or more even pressure to the actuator surfaces 12a and 12c between the clamping member 75 and base plate 70. The ceramic layer 67 which extends above the surface of the substrate 64 on the convex face 12a extends into the recessed area 80 of the switch plate 70. This prevents the ceramic layer 67 from contacting the upper surface 70a of the base plate 70, thereby reducing potential for damage to the ceramic layer 67.

The recess 80 is designed not only to prevent damage to the ceramic layer 67, but also to provide a surface along which electrical contact can be maintained with the electrode 68 on the convex face of the actuator 12. The recess 80 extends into the base plate 70 and has a variable depth, preferably being angled to accommodate the angle at which the convex face 12a of the actuator 12 rises from the recess 80 and above the top surface 70a of the base plate 70. More specifically, the recess 80 preferably has a deep end 81 and a shallow end 82 with its maximum depth at the deep end 81 beneath the clamping member 75 and substrate 12 just before where the ceramic layer 67 extends into the recess 80 at point C. The recess 80 then becomes shallower in the direction approaching the free end 122 of the actuator 12 until it reaches its minimum depth at the shallow end 82.

The recess 80 preferably contains a layer of rubber 85 along its lower surface which helps prevent the ceramic layer 67 from being damaged when the actuator 12 is deformed and the lower edge C of the ceramic layer 67 is pushed into the recess 80. Preferably the rubber layer 85 is of substantially uniform thickness along its length, the thickness of the rubber layer 85 being substantially equal to the depth of the recess 80 at the shallow end 82. The length of the rubber layer 85 is preferably slightly shorter than the length of the recess 80 to accommodate the deformation of the rubber layer 85 when the actuator 12 is pushed into the recess and rubber layer 85.

The rubber layer 85 preferably has a flexible electrode layer 90 overlying it to facilitate electrical contact with the aluminum layer 68 on the ceramic layer 67 on the convex face 12a of the actuator 12. More preferably, the electrode layer 90 comprises a layer of copper overlaying a layer of KAPTON film, as manufactured by E.I. du Pont de Nemours and Company, bonded to the rubber layer 85 with a layer of adhesive, preferably CIBA adhesive. The electrode layer 90 preferably extends completely across the rubber layer 85 from the deep end 81 to the shallow end 82 of the recess 80 and continues for a short distance on the top surface 70a of the base plate 70 beyond the recess 80.

In the preferred embodiment of the invention, the end 121 of the actuator 12 is not only secured between the clamping plate 75 and the base plate 70, but the aluminum electrode layer 68 covering the ceramic layer 67 of the actuator 12 is in constant contact with the electrode layer 90 in the recess 80 at all times, regardless of the position of the actuator 12 in its complete range of motion. To this end, the depth of the recess 80 (from the top surface 70a to the electrode 90) is at least equal to a preferably slightly less than the thickness of the laminate layers (adhesive layers 66, ceramic layer 67 and prestress layer 68) extending into the recess 80.

An assembly was built having the following illustrative dimensions. The actuator comprised a 1.59 by 1.79 inch spring steel substrate that was 8 mils thick. A 1–1.5 mil thick layer of adhesive having a nickel dust filler in a 1.51 inch square was placed one end of the substrate 0.02 inch from three sides of the substrate (leaving a 0.25 inch tab on one end 121 of the actuator). An 8-mil thick layer of PZT-5A in a 1.5 inch square was centered on the adhesive layer. A 1-mil thick layer of adhesive (with no metal filler) was placed in a 1.47 inch square centered on the PZT layer. Finally, a 1-mil thick layer of aluminum in a 1.46 inch square was centered on the adhesive layer. The tab 121 of the actuator was placed in a recess in a clamping block 76 having a length of 0.375 inch and a depth of 4 mils. The base plate 70 had a 0.26 in long recess 80 where the deep end 81 of the recess had a depth of 20 mils and tapered evenly to a depth of 15 mils at the shallow end 82 of the recess 80. A rubber layer 85 having a thickness of 15 mils and a length of 0.24 inches was placed in the recess 80. An electrode layer of 1 mil copper foil overlying 1 mil KAPTON tape was adhered to the rubber layer and extended beyond the recess 1.115 inches. The clamping member 75 was secured to the base plate 70 with a screw 76 and the aluminum second prestress layer of the actuator 12 contacted the electrode 90 in the recess 80 substantially tangentially (nearly parallel) to the angle the actuator 12 thereby maximizing the surface area of the electrical contact between the two.

As shown in FIG. 7, in an alternate embodiment of the invention, a weight 95 may be attached to the free end 122 of the actuator 12. The addition of the mass 95 to the free end 122 of the actuator 12, decreases the amount of damping of the oscillation and thereby increases the duration of oscillation of the actuator 12 when it was deflected and released. By having a longer duration and higher overall amplitude oscillation, the actuator 12 is capable of developing more electrical energy from its oscillation than an actuator 12 having no additional mass at its free end 122.

Referring to FIGS. 6 and 7: As mentioned above, it is desirable to generate an electrical signal by deforming the actuator 12. Deformation of the actuator 12 may be accomplished by any suitable means such as manually or by mechanical deflection means such as a plunger, lever or the like. In FIGS. 6 and 7 a simple deflector 72 is mounted to the base plate 70 in proximity to the free end 122 of the actuator 12. This deflector assembly 72 includes a lever 86 having first and second ends 87 and 88. The lever is pivotably mounted between the two ends 87 and 88 to a fulcrum 89. By exerting a force on the first end 87 of the lever 86 in the direction of arrow 91, the lever pivots about the fulcrum 89 and applies a mechanical impulse in the direction of arrow 81 to the free end 122 of the actuator 12. Alternatively, the lever 86 may be moved opposite the direction of arrow 91 and the actuator 12 may thus be deflected in the direction opposite arrow 81.

Referring now to FIGS. 13 and 14a–c: FIGS. 13 and 14a–c show the preferred embodiment of a casing with a deflector assembly 72 and containing the actuator 12. The base plate 70 forms the base of a casing 200, which encloses the actuator 12. On each side of the casing 200 is a wall 201, 202, 203 and 204 which extends perpendicularly from the top surface 70a of the base plate 70. On one end of the casing 200 is mounted a deflector assembly 72. The plunger has an interior surface 172b and an exterior surface 172a, as well as a free end 173 and a mounted end 174. More specifically, the plunger 172 is pivotably mounted on one end 174 to a wall 201 of the casing 200. The free end 173 of the plunger 172 has a ridge 173a thereon which engages a lip 202a on the opposite wall 202 of the casing. Preferably the free end 173 of the plunger 172 is spring loaded so that the ridge 173a is constantly urged towards the lip 202a. To this end, there is a preferably a spring 150 held in compression between the top surface 70a of the base plate 70 and the ridge 173a or interior surface of the plunger 172b. This provides for device wherein an actuator 12 mounted on a base plate 70 is contained within a casing 200 formed by the base plate 70 and four walls 201, 202, 203 and 204 as well as a plunger 172 pivotably mounted opposite the base plate 70 on a wall 201 of the casing 200. Because the plunger is pivotably mounted, placing pressure (in the direction of arrow 180 on the on the exterior surface 172a of the plunger 172 makes it pivot about the hinge 175 toward the top surface 70a of the base plate 70. Because the plunger is pivotably mounted and spring loaded, releasing pressure from the on the exterior surface 172a of the plunger 172 makes it pivot about the hinge 175 away the top surface of the base plate 70 until the ridge 173a catches on the lip 202a.

Within the casing 200 is a mounted quick release mechanism 180 comprising a spring loaded rocker arm 185 on the interior surface 172b of the plunger 172 which works in conjunction with a release pin 186 mounted on the top surface 70 of the base plate 70. The quick release mechanism 180 is designed to deflect and then quickly release the free end 122 of the actuator 12 in order to allow it to vibrate between positions 291 and 292. The quick release mechanism 180 is also designed not to interfere with the vibration of the actuator 12 as well as to return to a neutral position for follow-on deflections of the actuator 12.

Referring to FIGS. 14a–c: The rocker arm 185 is pivotably attached to the interior surface 172b of the plunger 172 above the free end 122 of the actuator 12. More specifically, the rocker arm 185 is pivotably attached in such a way that it has a neutral position from which it may pivot away from the clamped end 121 of the actuator, but will not pivot towards the clamped end 121 of the actuator 12 from that neutral position. In other words a rotational stop 183 forms part of the quick release mechanism 180 and its placement prevents the rocker arm from pivoting beyond the neutral position at the stop 183. The rocker arm 185 is preferably spring loaded in order to keep the rocker arm 185 in its neutral position when not being deflected. To this end a spring 187 in compression is placed on the side of the rocker arm 185 opposite the stop 183, between the rocker arm 185 and a spring stop 188.

Inside the casing 200 is also a release pin 186 which is located on the top surface 70a of the base plate 70. The release pin 186 is located in a position just beyond the free end 122 of the actuator 12 in its deflected position, but not beyond the rocker arm 185. In other words, when the plunger 172 is depressed toward the release pin 186, depressing with it the actuator 12 from position 291 to position 292, the release pin 186 will contact the rocker arm 185 but not the actuator 12. As the rocker arm 185 (and actuator 12) are depressed further, the release pin 186 pushes the rocker arm 185 away, making the rocker arm 185 pivot away from the clamped end 121 of the actuator 12. The rocker arm 185 pivots until the edge 122 of the actuator 12 is no longer held by the rocker arm 185 in position 292, at which point the edge 122 of the actuator 12 is released and springs back to its undeformed state, thereby oscillating between positions 291 and 292.

When pressure from the plunger 172 is released, the plunger 172 returns to its undeflected position (with the ridge 173a against the lip 202a) by virtue of the restoring force of the spring 150. Also when the pressure from the plunger 172 is released, and the plunger 172 returns to its undeflected position, the rocker arm 185 also returns to its undeflected position (above the actuator 12 against the stop 183) by virtue of the restoring force of the spring 187. Lastly, the actuator 12 also returns to its undeflected state in position 291 after its oscillations between positions 291 and 292 have ceased.

Referring now to FIGS. 14 and 16a–d: FIGS. 14 and 16a–d show an alternate embodiment of a deflector assembly 72 mounted to a casing 200 that contains the actuator 12. The base plate 70 forms the base of a casing 200, which encloses the actuator 12. On each side of the casing 200 is a wall 201, 202, 203 and 204 which extends perpendicularly from the top surface 70a of the base plate 70. Attached to the top of the walls of the casing 200 (opposite the base plate 70) is a face plate 220 to which is mounted a slide mechanism 230 that acts as a deflector assembly 72. The face plate 220 has an interior surface 220a and an exterior surface 220b and a channel 240 extending through substantially the center of the face plate 220. The channel 240 has a first end 241 and a second end 242 and extends substantially linearly along an axis L perpendicular to the first and second walls 201 and 202 of the casing 200. In other words, the first end 241 of the channel 240 through the face plate 220 is in proximity to the first wall 201 of the casing 200 and the second end 242 of the channel 240 through the face plate 220 is in proximity to the second wall 202 of the casing 200. The second end of the channel 240 preferably extends further towards the second wall 202 of the casing than does the free end 122 of the actuator 12.

The channel 240 is adapted to slidably retain a spring loaded paddle 250. Preferably, the paddle has first and second ends 251 and 252 respectively and a central pin 255. The channel in the face plate 220 allows the paddle to extend through the face plate 220, while also slidably retaining the central pin 255 in the channel 240. More specifically, the paddle 250 extends through the face plate 220 by means of the channel 240, along which the paddle may be slid in a direction parallel to the channels' axis L, i.e., from the clamped end 121 to the free end 122 of the actuator 12 and back. The first end 251 of the paddle 250 is located above the exterior surface 220b of the face plate 220 and the second end 252 of the paddle 250 is located within the casing 200 above the actuator 12. The paddle 250 is retained in the described position be means of the pin 255 which is retained in the channel 240. Thus, the width of the channel 240 at the exterior surface 220b is sufficient for the paddle upper portion 251 to pass through, as is the width of the channel 240 at the interior surface 220a is sufficient for the paddle lower portion 252 to pass through. The width and height of the channel 240 within the face plate 220 (between the interior and exterior surfaces 220a and 220b) is sufficient to accommodate the width and height of the central pin 255, which is wider than the width of the paddle upper and lower portions 251 and 252.

The first end 251 of the paddle 250 preferably extends a distance above the exterior surface 220b of the face plate 220 enough to be grasped manually. The second end 252 of the paddle 250 preferably extends into the casing 200 a distance above the actuator 12 such that the paddle 250 does not contact the clamping member 75 and/or clamped end 121 of the actuator 12, but also far enough that it may contact and deflect the free end 122 of the actuator 12. The paddle 250 is also preferably hinged at the second end 252 (within the casing 200 or the channel 240 at or in proximity to the central pin 255) in a manner that allows the second end 252 to pivot about the hinge or central pin 255 when travelling in one direction but not the other. Preferably, the second end 252 of the paddle 250 is hinged in a way that it may pivot when the paddle 250 is travelling toward the first wall 201 of the casing 200 but not pivot when travelling towards the second wall 202 of the casing 200.

Preferably the paddle 250 is also spring loaded so that the paddle is constantly urged along the channel 240 towards the first wall 201 of the casing 200. To that end, there is a spring 260 held between the paddle and the first 201 or second wall 202 of the casing 200 or most preferably the spring 260 held between the paddle 250 and the first or second end 241 or 242 of the channel 240. In order to urge the paddle toward the first wall 201 the spring 260 is either held in tension between the paddle 250 and the first end 241 of the channel 240, or most preferably the spring 260 is held in compression between the paddle 250 and the second end 242 of the channel 240.

This provides for device wherein an actuator 12 mounted on a base plate 70 is contained within a casing 200 formed by the base plate 70, four walls 201, 202, 203 and 204 and a face plate opposite the base plate 70. Because the paddle 250 is slidably mounted, placing pressure (in the direction of arrow 281 on the on the 251 first end of the paddle makes it slide along the channel 240 toward the second wall 202 of the casing 200. Because the paddle 250 is slidably mounted and spring loaded, releasing pressure from the paddle 250 makes it return along the channel 240 toward the first wall 201 of the casing 200 until it comes to rest against the first end 241 of the channel 240.

Referring to FIGS. 16a–d: The paddle upper portion 251 is pivotably attached to the paddle lower portion 252 below the interior surface 220a of the face plate 220 (within the casing 200) above the actuator 12. More specifically, the paddle lower portion 252 is pivotably attached in such a way that it has a neutral position from which it may pivot away from the clamped end 121 of the actuator, but will not pivot towards the clamped end 121 of the actuator 12 from that neutral position. In other words the shape of the paddle 250 prevents the lower portion 252 from pivoting beyond the neutral position.

In operation, when the paddle 250 is moved (in the direction of arrow 281) toward the second end 242 of the channel 240, the paddle lower portion 252 contacts concave face 12c of the actuator 12 and commences to deflect the actuator free end 122 (away from position 291). As the paddle 250 continues to move in the direction of arrow 281, the paddle lower portion 252 depresses the free end 122 of the actuator 12 to its maximum deflection at position 292 when the free end 122 is directly beneath the paddle lower portion 252. When the paddle moves further from this point in the direction of arrow 281, the free end 122 of the actuator 12 is abruptly released from the applied deflection of the paddle lower portion 252. Upon release, the edge 122 of the actuator 12 springs back to its undeformed state at position 291, thereby oscillating between positions 291 and 292. Upon release of pressure (in the direction of arrow 281) from the paddle 250, the paddle then travels in the direction of arrow 282, by virtue of the restoring force of the spring 260. As the paddle 250 returns towards its undeflected position (towards the first end 241 of the channel 240), the free end 122 of the actuator 12 in position 291 applies pressure against the lower portion 252 of the paddle 250. In response to the pressure being applied to the paddle lower portion opposite the direction of travel of the upper portion 251, the lower portion 252 pivots about the hinged central pin 255 of the paddle. After the paddle lower portion 252 has traveled in the direction of arrow 282 beyond the free end 122 of the actuator, the lower portion 252 returns to its undeflected (unbent) state. The pivoting of the paddle lower portion 252 allows the paddle 250 to return to its neutral undeflected position at the first end 241 of the channel 240.

Figure 10A:
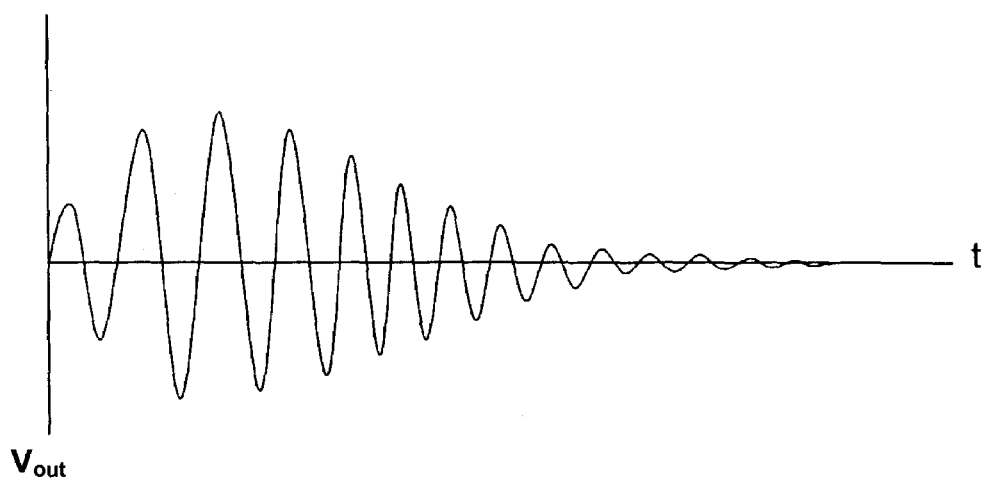
FIGS. 10a–c show the electrical signal generated by the actuator, the rectified electrical signal and the regulated electrical signal respectively.

When the end 122 of the actuator 12 is deflected and then released (either manually or using a deflector assembly 72 such as in FIGS. 6–7, or 13—16), the end 122 of the actuator 12, much like a diving board, oscillates back and forth between positions 291 and 292. This is because the substrate and prestress layer 64 and 68 to which the ceramic 67 is bonded exert a compressive force on the ceramic 67 thereby providing a restoring force. Therefore, the actuator 12 has a coefficient of elasticity or spring constant that causes the actuator 12 to return to its undeformed neutral state at position 291. The oscillation of the actuator 12 has the waveform of a damped harmonic oscillation, as is illustrated in FIG. 10a. In other words, the amplitude of the oscillation of the free end 122 of the actuator 12 is at its maximum immediately following (within a few oscillations after) the release of the mechanical impulse from the free end 122 of the actuator 12. As the actuator 12 continues to vibrate, the amplitude gradually decreases over time (approximately exponentially) until the actuator 12 is at rest in its neutral position.

The applied force, whether by manual or other mechanical deflection means 72 causes the piezoelectric actuator 12 to deform and by virtue of the piezoelectric effect, the deformation of the piezoelectric element 67 generates an instantaneous voltage between the faces 12a and 12c of the actuator 12, which produces an electrical signal. Furthermore, when the force is removed from the piezoelectric actuator 12, the actuator oscillates between positions 291 and 292 until it gradually returns to its original shape. As the actuator 12 oscillates, the ceramic layer 67 strains, becoming alternately more compressed and less compressed. The polarity of the voltage produced by the ceramic layer 67 depends on the direction of the strain, and therefore, the polarity of the voltage generated in compression is opposite to the polarity of the voltage generated in tension. Therefore, as the actuator 12 oscillates, the voltage produced by the ceramic element 67 oscillates between a positive and negative voltage for a duration of time. The duration of the oscillation, and therefore the duration of the oscillating electrical signal produced, is preferably in the range of 100–250 milliseconds, depending on the shape, mounting and amount of force applied to the actuator 12.

The electrical signal generated by the actuator 12 is applied to downstream circuit elements via wires 14 connected to the actuator 12. More specifically, a first wire 14 is connected to the electrode 90 which extends into the recess 80 and contacts the electrode 68 on the convex face 12a of the actuator 12. Preferably the wire 14 is connected to the electrode 90 outside of the recess close to the end of the base plate 70 opposite the end having the clamping member 75. A second wire 14 is connected directly to the first prestress layer 64, i.e., the substrate 64 which acts as an electrode on the concave face 12c of the actuator 12.

Figure 8:
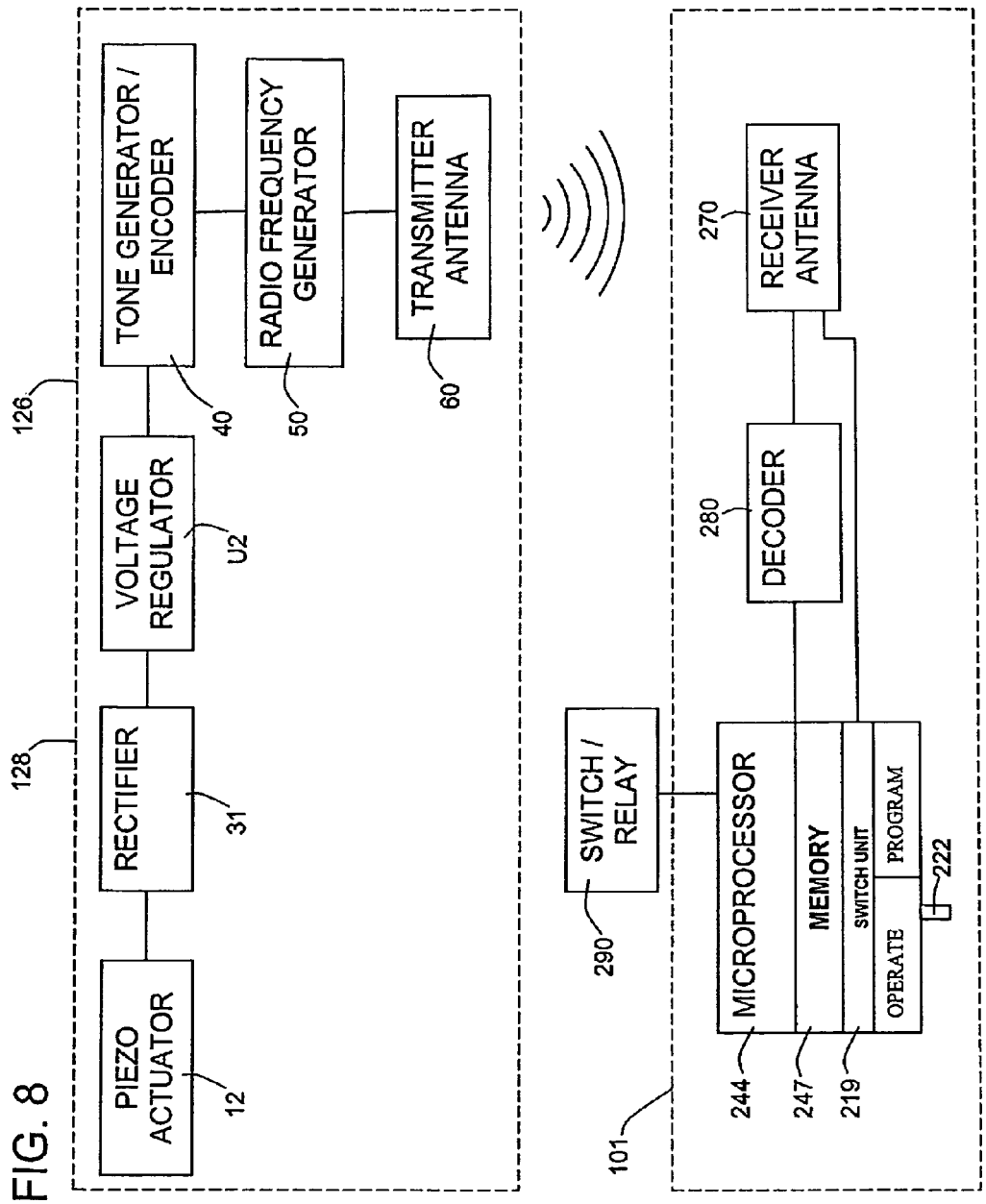
FIG. 8 is a block diagram showing the components of a circuit for using the electrical signal generated by the device of FIG. 6 or 7.
Figure 10B:
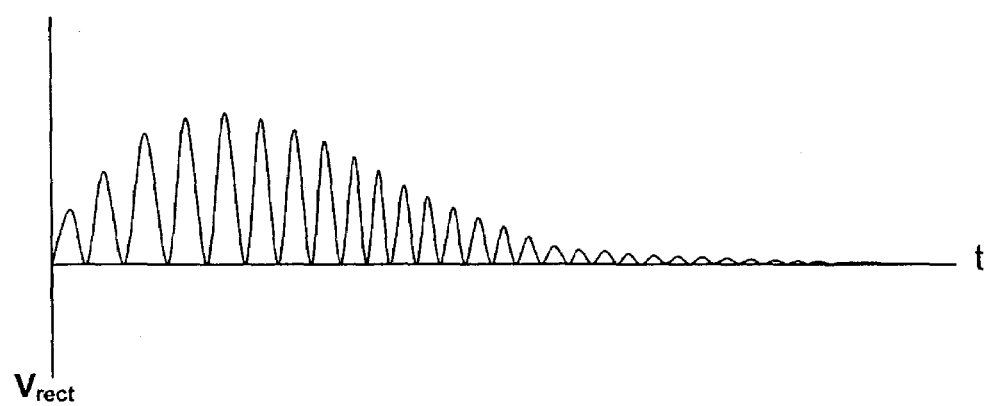

Referring to FIG. 8, the actuator 12 is connected to circuit components downstream in order to generate an RF signal for actuation of a switch initiator. These circuit components include a rectifier 31, a voltage regulator U2, an encoder 40 (preferably comprising a peripheral interface controller (PIC) chip) as well as an RF generator 50 and antenna 60. FIG. 10b shows the waveform of the electrical signal of FIG. 10a after it has been rectified. FIG. 1c shows the waveform of the rectified electrical signal of FIG. 10b after it has been regulated to a substantially uniform voltage, preferably 3.3 VDC.

Figure 9:
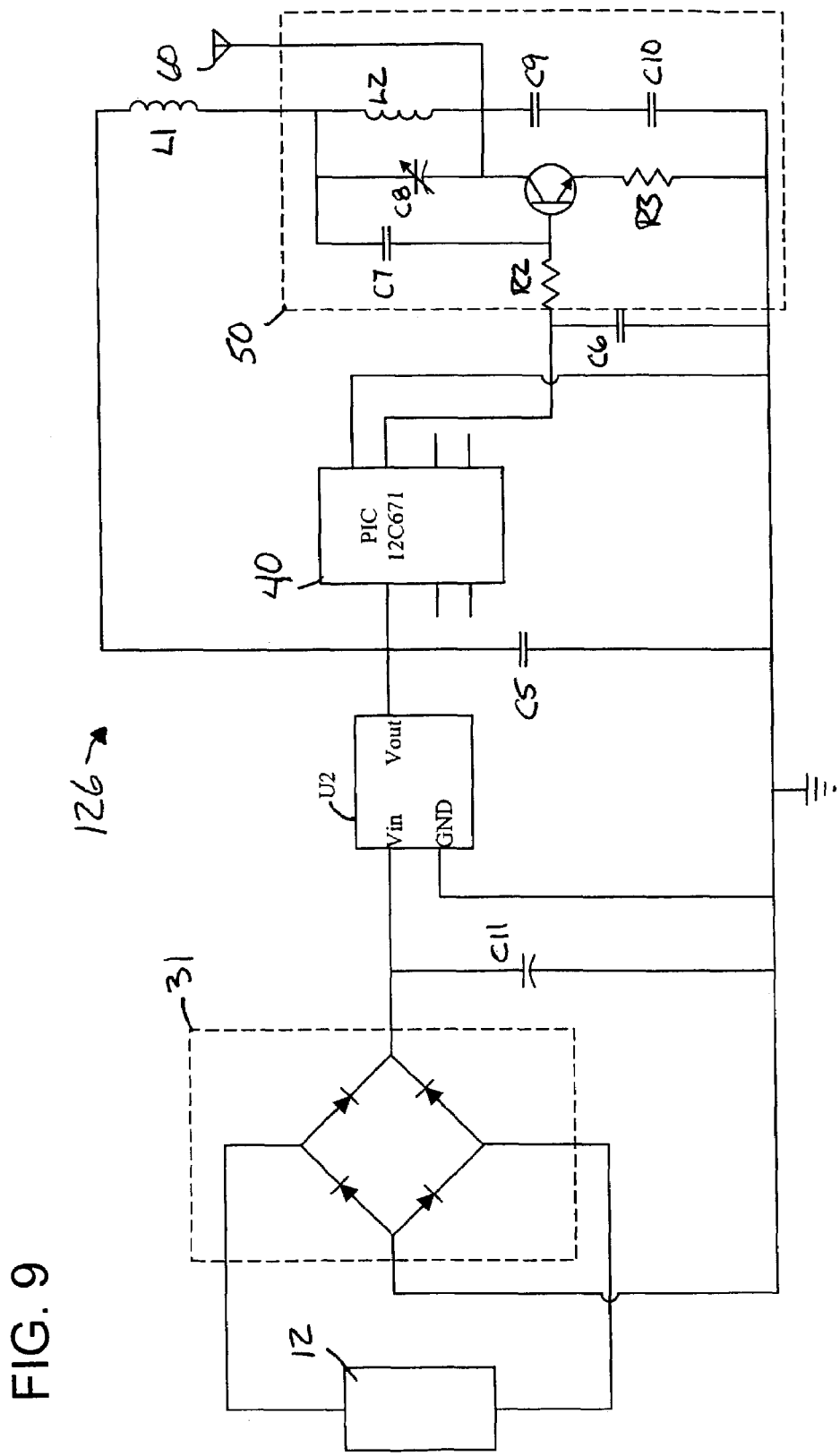
FIG. 9 a detailed circuit diagram of the circuit in FIG. 8.

Referring now to FIG. 9: The actuator 12 is first connected to a rectifier 31. Preferably the rectifier 31 comprises a bridge rectifier 31 comprising four diodes D1, D2, D3 and D4 arranged to only allow positive voltages to pass. The first two diodes D1 and D2 are connected in series, i.e., the anode of D1 connected to the cathode of D2. The second two diodes D3 and D4 are connected in series, i.e., the anode of D3 connected to the cathode of D4. The anodes of diodes D2 and D4 are connected, and the cathodes of diodes D1 and D3 are connected, thereby forming a bridge rectifier. The rectifier is positively biased toward the D2–D4 junction and negatively biased toward the D1–D3 junction. One of the wires 14 of the actuator 12 is electrically connected between the junction of diodes D1 and D2, whereas the other wire 14 (connected to the opposite face of the actuator 12) is connected to the junction of diodes D3 and D4. The junction of diodes D1 and D3 are connected to ground. A capacitor C11 is preferably connected on one side to the D2–D4 junction and on the other side of the capacitor C11 to the D1–D3 junction in order to isolate the voltages at each side of the rectifier from each other. Therefore, any negative voltages applied to the D1–D2 junction or the D3–D4 junction will pass through diodes D1 or D3 respectively to ground. Positive voltages applied to the D1–D2 junction or the D3–D4 junction will pass through diodes D2 or D4 respectively to the D2–D4 junction. The rectified waveform is shown in FIG. 10b.

Figure 10C:
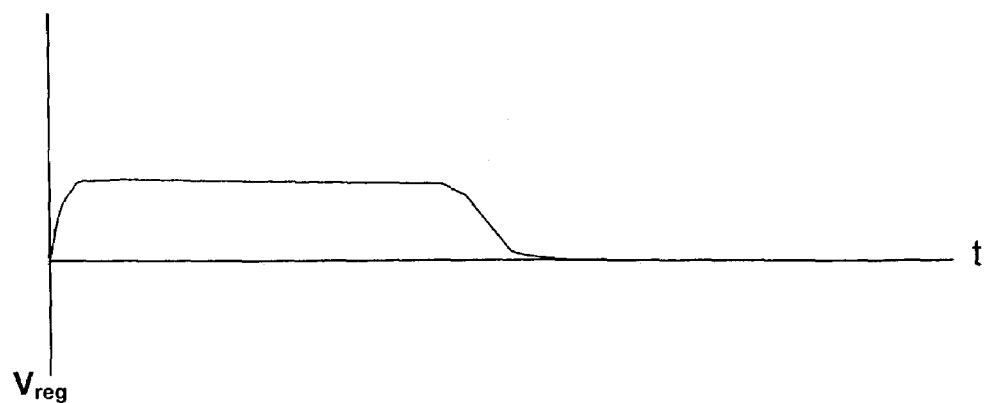

The circuit also comprises a voltage regulator U2, which controls magnitude of the input electrical signal downstream of the rectifier 31. The rectifier 31 is electrically connected to a voltage regulator U2 with the D2–D4 junction connected to the Vin pin of the voltage regulator U2 and with the D1–D3 junction connected to ground and the ground pin of the voltage regulator U2. The voltage regulator U2 comprises for example a LT1121 chip voltage regulator U2 with a 3.3 volts DC output. The output voltage waveform is shown in FIG. 10c and comprises a substantially uniform voltage signal of 3.3 volts having a duration of approximately 100–250 milliseconds, depending on the load applied to the actuator 12. The regulated waveform is shown in FIG. 10b. The output voltage signal from the voltage regulator (at the Vout pin) may then be transmitted via another conductor to the relay switch 290, in order to change the position of a relay switch 290 from one position to another. Preferably however, the output voltage is connected through an encoder 40 to an RF generation section 50 of the circuit.

Referring again to FIGS. 8 and 9: The output of the voltage regulator U2 is preferably used to power an encoder 40 or tone generator comprising a peripheral interface controller (PIC) microcontroller that generates a pulsed tone. This pulsed tone modulates an RF generator section 50 which radiates an RF signal using a tuned loop antenna 60. The signal radiated by the loop antenna is intercepted by an RF receiver 270 and a decoder 280 which generates a relay pulse to activate the relay 290.

The output of the voltage regulator U2 is connected to a PIC microcontroller, which acts as an encoder 40 for the electrical output signal of the regulator U2. More specifically, the output conductor for the output voltage signal (nominally 3.3 volts) is connected to the input pin of the programmable encoder 40. Types of register-based PIC microcontrollers include the eight-pin PIC12C5XX and PIC12C67x, baseline PIC16C5X, midrange PIC16CXX and the high-end PIC17CXX/PIC18CXX. These controllers employ a modified Harvard, RISC architecture that support various-width instruction words. The datapaths are 8 bits wide, and the instruction widths are 12 bits wide for the PIC16C5X/PIC12C5XX, 14 bits wide for the PIC12C67X/PIC16CXX, and 16 bits wide for the PIC17CXX/PIC18CXX. PICMICROS are available with one-time programmable EPROM, flash and mask ROM. The PIC17CXX/PIC18CXX support external memory. The encoder 40 comprises for example a PIC model 12C671. The PIC12C6XX products feature a 14-bit instruction set, small package footprints, low operating voltage of 2.5 volts, interrupts handling, internal oscillator, on-board EEPROM data memory and a deeper stack. The PIC12C671 is a CMOS microcontroller programmable with 35 single word instructions and contains 1024×14 words of program memory, and 128 bytes of user RAM with 10 MHz maximum speed. The PIC12C671 features an 8-level deep hardware stack, 2 digital timers (8-bit TMRO and a Watchdog timer), and a four-channel, 8-bit A/D converter.

The output of the PIC may include square, sine or saw waves or any of a variety of other programmable waveforms. Typically, the output of the encoder 40 is a series of binary square waveforms (pulses) oscillating between 0 and a positive voltage, preferably +3.3 VDC. The duration of each pulse (pulse width) is determined by the programming of the encoder 40 and the duration of the complete waveform is determined by the duration of output voltage pulse of the voltage regulator U2. A capacitor C5 is preferably be connected on one end to the output of the voltage regulator U2, and on the other end to ground to act as a filter between the voltage regulator U2 and the encoder 40.

Thus, the use of an IC as a tone generator or encoder 40 allows the encoder 40 to be programmed with a variety of values. The encoder 40 is capable of generating one of many unique encoded signals by simply varying the programming for the output of the encoder 40. More specifically, the encoder 40 can generate one of a billion or more possible codes. It is also possible and desirable to have more than one encoder 40 included in the circuit in order to generate more than one code from one actuator or transmitter. Alternately, any combination of multiple actuators and multiple pulse modification subcircuits may be used together to generate a variety of unique encoded signals. Alternately the encoder 40 may comprise one or more inverters forming a series circuit with a resistor and capacitor, the output of which is a square wave having a frequency determined by the RC constant of the encoder 40.

The DC output of the voltage regulator U2 and the coded output of the encoder 40 are connected to an RF generator 50. A capacitor C6 may preferably be connected on one end to the output of the encoder 40, and on the other end to ground to act as a filter between the encoder 40 and the RF generator 50. The RF generator 50 consists of tank circuit connected to the encoder 40 and voltage regulator U2 through both a bipolar junction transistor (BJT) Q1 and an RF choke. More specifically, the tank circuit consists of a resonant circuit comprising an inductor L2 and a capacitor C8 connected to each other at each of their respective ends (in parallel). Either the capacitor C8 or the inductor L2 or both may be tunable in order to adjust the frequency of the tank circuit. An inductor L1 acts as an RF choke, with one end of the inductor L1 connected to the output of the voltage regulator U2 and the opposite end of the inductor L1 connected to a first junction of the L2–C8 tank circuit. Preferably, the RF choke inductor L1 is an inductor with a diameter of approximately 0.125 inches and turns on the order of thirty and is connected on a loop of the tank circuit inductor L2. The second and opposite junction of the L2–C8 tank circuit is connected to the collector of BJT Q1. The base of the BJT Q1 is also connected through resistor R2 to the output side of the encoder 40. A capacitor C7 is connected to the base of a BJT Q1 and to the first junction of the tank circuit. Another capacitor C9 is connected in parallel with the collector and emitter of the BJT Q1. This capacitor C9 improves the feedback characteristics of the tank circuit. The emitter of the BJT Q1 is connected through a resistor R3 to ground. The emitter of the BJT Q1 is also connected to ground through capacitor C10 which is in parallel with the resistor R3. The capacitor C10 in parallel with the resistor R4 provides a more stable conduction path from the emitter at high frequencies.

Figure 11:
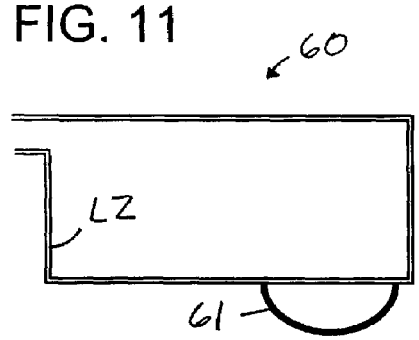
FIG. 11 is a plan view of a tuned loop antenna of FIG. 8 illustrating the jumper at a position maximizing the inductor cross-section.
Figure 12:
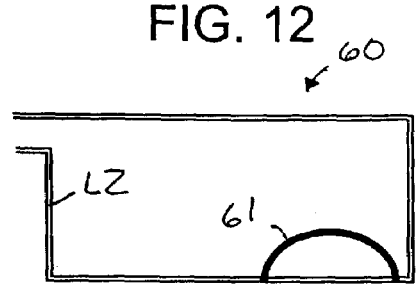
FIG. 12 is a plan view of the tuned loop antenna of FIG. 8 illustrating the jumper at a position minimizing the inductor cross-section.
Figure 13:
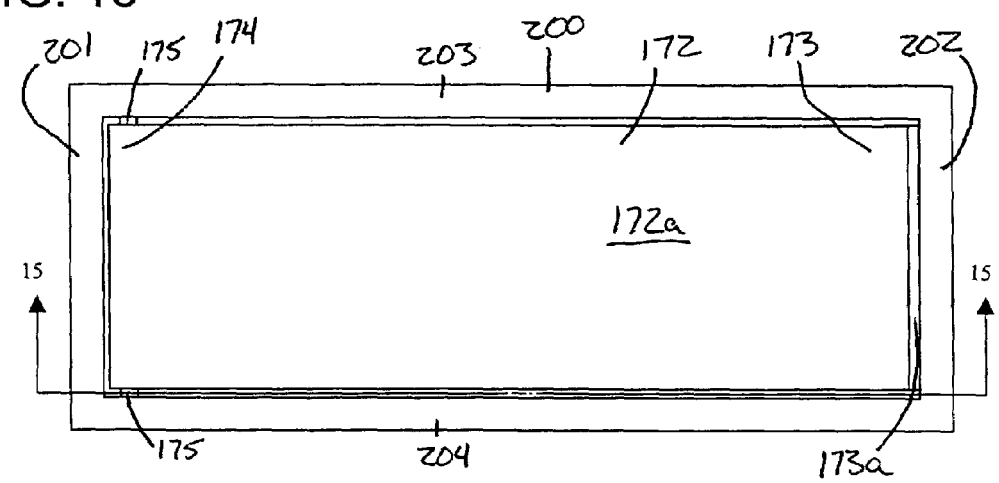
FIG. 13 is an elevation view of a preferred deflector assembly and casing which enclose the actuator of the present invention.
Figure 14:
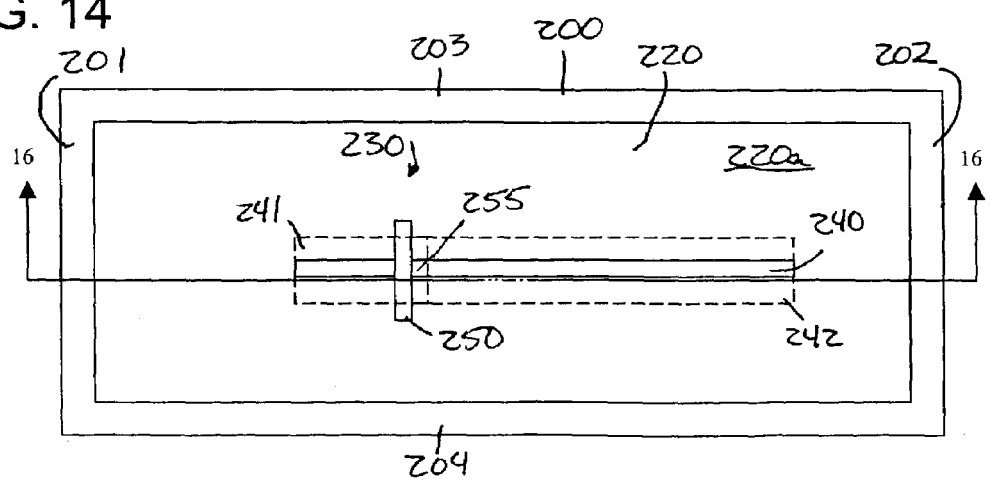
FIG. 14 is an elevation view of an alternate embodiment a deflector assembly using a sliding paddle.
Figure 15A:
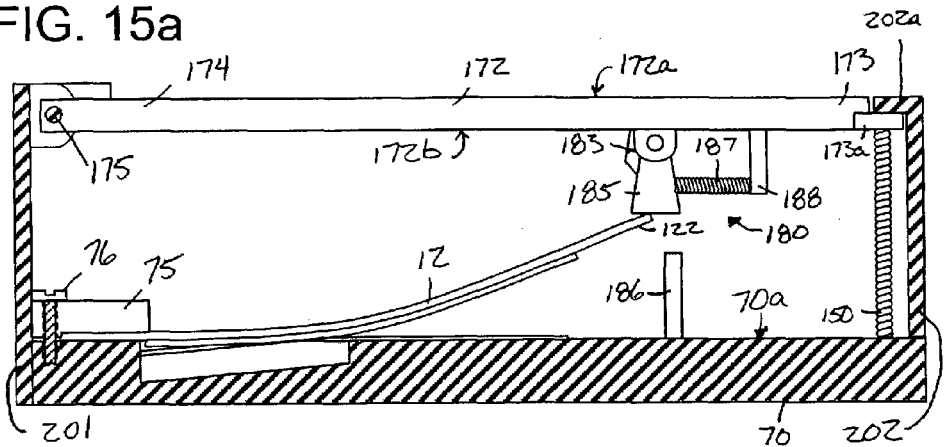
FIGS. 15a–c are elevational cross-sections taken along line 15—15 of FIG. 13 showing the preferred embodiment of a casing and deflector assembly using a quick release mechanism.
Figure 15B:
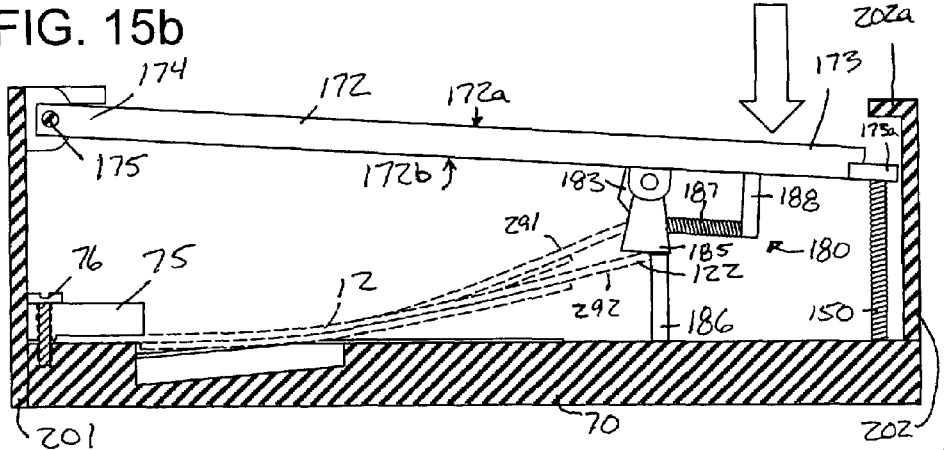
Figure 15C:
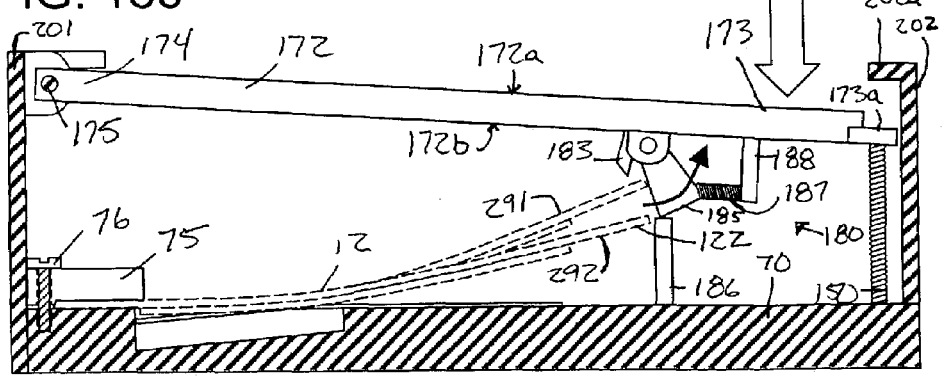
Figure 16A:
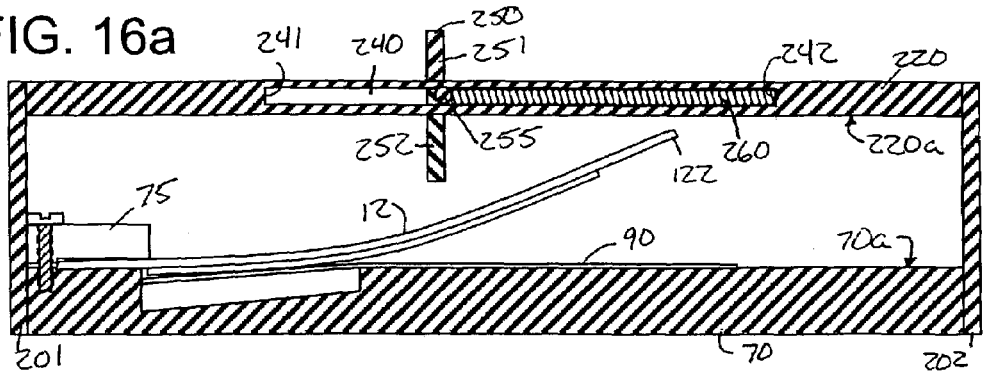
FIGS. 16a–d are elevational cross-sections taken along line 16—16 of FIG. 14.
Figure 16B:
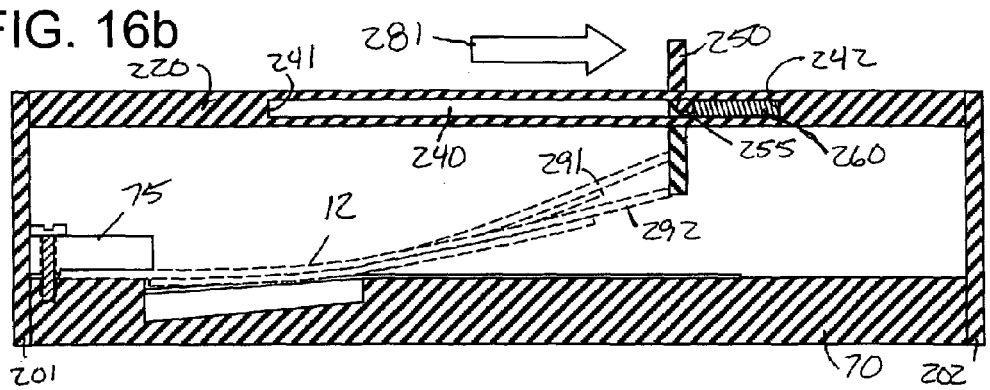
Figure 16C:
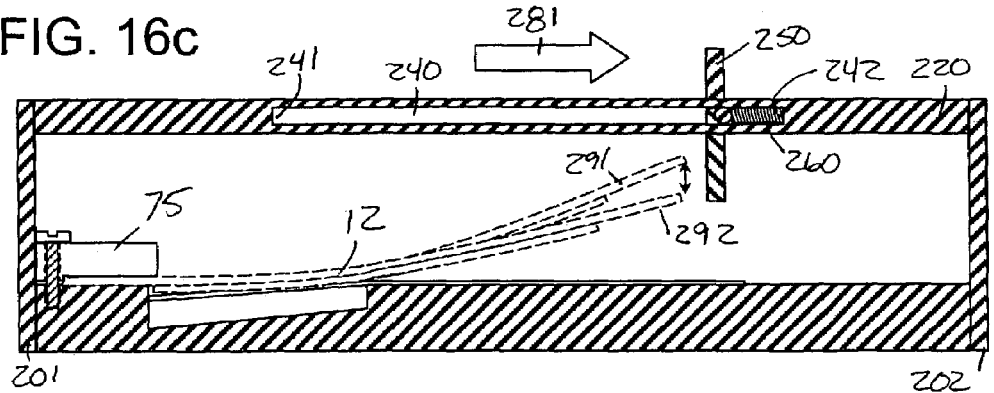
Figure 16D:
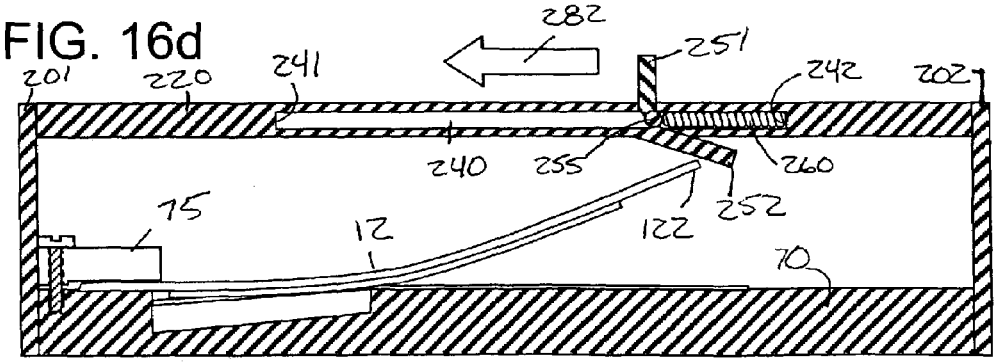

Referring now to FIGS. 11 and 12: The RF generator 50 works in conjunction with a tuned loop antenna 60. In the preferred embodiment, the inductor L2 of the tank circuit serves as the loop antenna 60. More preferably, the inductor/loop antenna L2 comprises a single rectangular loop of copper wire having an additional smaller loop or jumper 61 connected to the rectangular loop L2. Adjustment of the shape and angle of the smaller loop 61 relative to the rectangular loop L2 is used to increase or decrease the apparent diameter of the inductor L2 and thus tunes the RF transmission frequency of the RF generator 50. In an alternate embodiment, a separate tuned antenna may be connected to the second junction of the tank circuit.

In operation: The positive voltage output from the voltage regulator U2 is connected the encoder 40 and the RF choke inductor L1. The voltage drives the encoder 40 to generate a coded square wave output, which is connected to the base of the BJT Q1 through resistor R2. When the coded square wave voltage is zero, the base of the BJT Q1 remains de-energized, and current does not flow through the inductor L1. When the coded square wave voltage is positive, the base of the BJT Q1 is energized through resistor R2. With the base of the BJT Q1 energized, current is allowed to flow across the base from the collector to the emitter and current is also allowed to flow across the inductor L1. When the square wave returns to a zero voltage, the base of the BJT Q1 is again de-energized.

When current flows across the choke inductor L1, the tank circuit capacitor C8 charges. Once the tank circuit capacitor C8 is charged, the tank circuit begins to resonate at the frequency determined by the circuit's LC constant. For example, a tank circuit having a 7 picofarad capacitor and an inductor L2 having a single rectangular loop measuring 0.7 inch by 0.3 inch, the resonant frequency of the tank circuit is 310 MHz. The choke inductor L1 prevents RF leakage into upstream components of the circuit (the PIC) because changing the magnetic field of the choke inductor L1 produces an electric field opposing upstream current flow from the tank circuit. To produce an RF signal, charges have to oscillate with frequencies in the RF range. Thus, the charges oscillating in the tank circuit inductor/tuned loop antenna L2 produce an RF signal of preferably 310 MHz. As the square wave output of the inverter turns the BJT Q1 on and off, the signal generated from the loop antenna 60 comprises a pulsed RF signal having a duration of 100–250 milliseconds and a pulse width determined by the encoder 40, (typically of the order of 0.1 to 5.0 milliseconds thus producing 20 to 2500 pulses at an RF frequency of approximately 310 MHz. The RF generator section 50 is tunable to multiple frequencies. Therefore, not only is the transmitter capable of a great number of unique codes, it is also capable of generating each of these codes at a different frequency, which greatly increases the number of possible combinations of unique frequency-code signals.

The RF generator 50 and antenna 60 work in conjunction with an RF receiver 270. More specifically, an RF receiver 270 in proximity to the RF transmitter 60 (within 300 feet) can receive the pulsed RF signal transmitted by the RF generator 50. The RF receiver 270 comprises a receiving antenna 270 for intercepting the pulsed RF signal (tone). The tone generates a pulsed electrical signal in the receiving antenna 270 that is input to a microprocessor chip that acts as a decoder 280. The decoder 280 filters out all signals except for the RF signal it is programmed to receive, e.g., the signal generated by the RF generator 50. An external power source is also connected to the microprocessor chip/decoder 280. In response to the intercepted tone from the RF generator 50, the decoder chip produces a pulsed electrical signal. The external power source connected to the decoder 280 augments the pulsed voltage output signal developed by the chip. This augmented (e.g., 120VAC) voltage pulse is then applied to a conventional relay 290 for changing the position of a switch within the relay. Changing the relay switch position is then used to turn an electrical device with a bipolar switch on or off, or toggle between the several positions of a multiple position switch. Zero voltage switching elements may be added to ensure the relay 290 activates only once for each depression and recovery cycle of the flextensional transducer element 12.

Switch Initiator System with Trainable Receiver

Several different RF transmitters may be used that generate different tones for controlling relays that are tuned to receive that tone. In another embodiment, digitized RF signals may be coded and programmable (as with a garage door opener) to only activate a relay that is coded with that digitized RF signal. In other words, the RF transmitter is capable of generating at least one tone, but is preferably capable of generating multiple tones. Most preferably, each transmitter is programmed with one or more unique coded signals. This is easily done, since programmable ICs for generating the tone can have over $2^{30}$ possible unique signal codes which is the equivalent of over 1 billion codes. Most preferably the invention comprises a system of multiple transmitters and one or more receivers for actuating building lights, appliances, security systems and the like. In this system for remote control of these devices, an extremely large number of codes are available for the transmitters for operating the lights, appliances and/or systems and each transmitter has at least one unique, permanent and nonuser changeable code. The receiver and controller module at the lights, appliances and/or systems is capable of storing and remembering a number of different codes corresponding to different transmitters such that the controller can be programmed so as to actuated by more than one transmitted code, thus allowing two or more transmitters to actuate the same light, appliance and/or system.

The remote control system includes a receiver/controller for learning a unique code of a remote transmitter to cause the performance of a function associated with the system, light or appliance with which the receiver/controller module is associated. The remote control system is advantageously used, in one embodiment, for interior or exterior lighting, household appliances or security system. Preferably, a plurality of transmitters is provided wherein each transmitter has at least one unique and permanent non-user changeable code and wherein the receiver can be placed into a program mode wherein it will receive and store two or more codes corresponding to two or more different transmitters. The number of codes which can be stored in transmitters can be extremely high as, for example, greater than one billion codes. The receiver has a decoder module therein which is capable of learning many different transmitted codes, which eliminates code switches in the receiver and also provides for multiple transmitters for actuating the light or appliance. Thus, the invention makes it possible to eliminate the requirements for code selection switches in the transmitters and receivers.

Referring to FIG. 8: The receiver module 101 includes a suitable antenna 270 for receiving radio frequency transmissions from one or more transmitters 126 and 128 and supplies an input to a decoder 280 which provides an output to a microprocessor unit 244. The microprocessor unit 244 is connected to a relay device 290 or controller which switches the light or appliance between one of two or more operation modes, i.e., on, off, dim, or some other mode of operation. A switch 222 is mounted on a switch unit 219 connected to the receiver and also to the microprocessor 244. The switch 222 is a two position switch that can be moved between the "operate" and "program" positions to establish operate and program modes.

In the invention, each transmitter, such as transmitters 126 and 128, has at least one unique code which is determined by the tone generator/encoder 40 contained in the transmitter. The receiver unit 101 is able to memorize and store a number of different transmitter codes which eliminates the need of coding switches in either the transmitter or receiver which are used in the prior art. This also eliminates the requirement that the user match the transmitter and receiver code switches. Preferably, the receiver 101 is capable of receiving many transmitted codes, up to the available amount of memory locations 147 in the microprocessor 144, for example one hundred or more codes.

When the controller 290 for the light or appliance is initially installed, the switch 222 is moved to the program mode and the first transmitter 126 is energized so that the unique code of the transmitter 126 is transmitted. This is received by the receiver module 101 having an antenna 270 and decoded by the decoder 280 and supplied to the microprocessor unit 244. The code of the transmitter 126 is then supplied to the memory address storage 247 and stored therein. Then if the switch 222 is moved to the operate mode and the transmitter 126 energized, the receiver 270, decoder 280 and the microprocessor 244 will compare the received code with the code of the transmitter 126 stored in the first memory location in the memory address storage 247 and since the stored memory address for the transmitter 126 coincides with the transmitted code of the transmitter 126 the microprocessor 244 will energize the controller mechanism 290 for the light or appliance to energize de-energize or otherwise operate the device.

In order to store the code of the second transmitter 128 the switch 222 is moved again to the program mode and the transmitter 128 is energized. This causes the receiver 270 and decoder 280 to decode the transmitted signal and supply it to the microprocessor 244 which then supplies the coded signal of the transmitter 128 to the memory address storage 247 where it is stored in a second address storage location. Then the switch 222 is moved to the operate position and when either of the transmitters 126 and 128 are energized, the receiver 270 decoder 280 and microprocessor 244 will energize the controller mechanism 290 for the light or appliance to energize de-energize or otherwise operate the device. Alternately, the signal from the first transmitter 126 and second transmitter 128 may cause separate and distinct actions to be performed by the controller mechanism 290.

Thus, the codes of the transmitters 126 and 128 are transmitted and stored in the memory address storage 247 during the program mode after which the system, light or appliance controller 290 will respond to either or both of the transmitters 126 and 128. Any desired number of transmitters can be programmed to operate the system, light or appliance up to the available memory locations in the memory address storage 247.

This invention eliminates the requirement that binary switches be set in the transmitter or receiver as is done in systems of the prior art. The invention also allows a controller to respond to a number of different transmitters because the specific codes of a number of the transmitters are stored and retained in the memory address storage 247 of the receiver module 101.

In yet another more specific embodiment of the invention, each transmitter 126 or 128 contains two or more unique codes for controlling a system, light or appliance. One code corresponds in the microprocessor to the "on" position and another code corresponds in the microprocessor 244 to the "off" position of the controller 290. Alternately, the codes may correspond to "more" or "less" respectively in order to raise or lower the volume of a sound device or to dim or undim lighting for example. Lastly, the unique codes in a transmitter 126 or 128 may comprise four codes which the microprocessor interprets as "on", "off", "more" and "less" positions of the controller 290, depending on the desired setup of the switches. Alternatively, a transmitter 126 or 128 may only have two codes, but the microprocessor 244 interprets repeated pushes of "on" or "off" signals respectively to be interpreted as dim up and dim down respectively.

In another embodiment of the invention, receiver modules 101 may be trained to accept the transmitter code(s) in one-step. Basically, the memory 247 in the microprocessor 244 of the receiver modules 101 will have "slots" where codes can be stored. For instance one slot may be for all of the codes that the memory 247 accepts to be turned on, another slot for all the off codes, another all the 30% dimmed codes, etc.

Each transmitter 126 has a certain set of codes. For example one transmitter may have just one code, a "toggle" code, wherein the receiver module 101 knows only to reverse its current state, if it's on, turn off, and if it's off, turn on. Alternatively, a transmitter 126 may have many codes for the complex control of appliances. Each of these codes is "unique". The transmitter 126 sends out its code set in a way in which the receiver 101 knows in which slots to put each code. Also, with the increased and longer electrical signal that can be generated in the transmitter 126, a single transmission of a code set is achievable even with mechanically produced voltage. As a back-up, if this is not true, and if wireless transmission uses up more electricity than we have available, some sort of temporary wired connection (jumper not shown) between each transmitter and receiver target is possible. Although the disclosed embodiment shows manual or mechanical interaction with the transmitter and receiver to train the receiver, it is yet desirable to put the receiver in reprogram mode with a wireless transmission, for example a "training" code.

In yet another embodiment of the invention, the transmitter 126 may have multiple unique codes and the transmitter randomly selects one of the multitude of possible codes, all of which are programmed into the memory allocation spaces 247 of the microprocessor 244.

In yet another embodiment of the invention, the transmitter 126 signal need not be manually operated or triggered, but may as easily be operated by any manner of mechanical force, i.e., the movement of a window, door, safe, foot sensor, etc. and that a burglar alarm sensor might simultaneously send a signal to the security system and a light in the intruded upon room. Likewise, the transmitter 126 may be combined with other apparatus. For example, a transmitter 126 may be located within a garage door opener which can also turn on one or more lights in the house, when the garage door opens.

Furthermore, the transmitters can talk to a central system or repeater which re-transmits the signals by wire or wireless means to lights and appliances. In this manner, one can have one transmitter/receiver set, or many transmitters interacting with many different receivers, some transmitters talking to one or more receivers and some receivers being controlled by one or more transmitters, thus providing a broad system of interacting systems and wireless transmitters. Also, the transmitters and receivers may have the capacity of interfacing with wired communications like SMARTHOME or BLUETOOTH.

While in the preferred embodiment of the invention, the actuation means has been described as from mechanical to electric, it is within the scope of the invention to include batteries in the transmitter to power or supplement the power of the transmitter. For example, rechargeable batteries may be included in the transmitter circuitry and may be recharged through the electromechanical actuators. These rechargeable batteries may thus provide backup power to the transmitter.

It is seen that the present invention allows a receiving system to respond to one of a plurality of transmitters which have different unique codes which can be stored in the receiver during a program mode. Each time the "program mode switch" 222 is moved to the program position, a different storage can be connected so that the new transmitter code would be stored in that address. After all of the address storage capacity have been used additional codes would erase all old codes in the memory address storage before storing a new one.

This invention is safe because it eliminates the need for 120 VAC (220 VAC in Europe) lines to be run to each switch in the house. Instead the higher voltage overhead AC lines are only run to the appliances or lights, and they are actuated through the self-powered switching device and relay switch. The invention also saves on initial and renovation construction costs associated with cutting holes and running the electrical lines to/through each switch and within the walls. The invention is particularly useful in historic structures undergoing preservation, as the walls of the structure need not be destroyed and then rebuilt. The invention is also useful in concrete construction, such as structures using concrete slab and/or stucco construction and eliminate the need to have wiring on the surface of the walls and floors of these structures.

While the above description contains many specificities, these should not be construed as limitations on the scope of the invention, but rather as an exemplification of one preferred embodiment thereof. Many other variations are possible, for example:

In addition to piezoelectric devices, the electroactive elements may comprise magnetostrictive or ferroelectric devices;

Rather than being arcuate in shape, the actuators may normally be flat and still be deformable;

Multiple high deformation piezoelectric actuators may be placed, stacked and/or bonded on top of each other;

Multiple piezoelectric actuators may be placed adjacent each other to form an array.

Larger or different shapes of THUNDER elements may also be used to generate higher impulses.

The piezoelectric elements may be flextensional actuators or direct mode piezoelectric actuators.

A bearing material may be disposed between the actuators and the recesses or switch plate in order to reduce friction and wearing of one element against the next or against the frame member of the switch plate.

Other means for applying pressure to the actuator may be used including simple application of manual pressure, rollers, pressure plates, toggles, hinges, knobs, sliders, twisting mechanisms, release latches, spring loaded devices, foot pedals, game consoles, traffic activation and seat activated devices.

We claim:

1. A self-powered switching system, comprising:
a flextensional transducer, said flextensional transducer comprising;
  a first electroactive member having opposing first and second electroded major faces;
    said first opposing major face being substantially convex and said second opposing major face being substantially concave;
  a prestress layer bonded to said second major face of said first electroactive member;
    said prestress layer applying a compressive force to said electroactive member;
    said prestress layer having first and second ends adjacent said concave face of said first electroactive member;
  wherein said flextensional transducer is adapted to deform from a first position to a second position upon application of a force to said flextensional transducer;
  and wherein upon said deformation to said second position, said flextensional transducer is adapted to generate a first voltage potential between said first electroded major face and said second electroded major face;
a mounting member for retaining said first end of said prestress layer;
  said mounting member comprising a plate adjacent said first end of said prestress layer and said convex face of said flextensional transducer;
  said mounting member comprising clamping means adjacent said first end of said prestress layer and said concave face of said flextensional transducer;
pressure application means for application of a force to said second end of said prestress layer, said pressure application means being adapted to apply a force sufficient to deform said flextensional transducer from said first position to said second position, thereby generating said first voltage potential;
a first conductor electrically connected to said first electroded major face of said first electroactive member;
a second conductor electrically connected to said second electroded major face of said first electroactive member;
first signal transmission means electrically connected to said first and second conductors;
  said first signal transmission means comprising a first radio frequency generator subcircuit connected to an antenna;
signal reception means for receiving a first signal transmitted by said first signal transmission means;
  said signal reception means being adapted to generate a second signal in response to said first signal transmitted by said signal transmission means; and
a switch having a first position and a second position;
  said switch being in communication with said signal reception means;
  said switch being adapted to change between said first position and said second position in response to said second signal.

2. The switching system according to claim 1:
wherein said mounting member further comprises a recess defining a depressed surface in said plate, said depressed surface substantially conforming to at least a portion of said convex face of said flextensional transducer adjacent said first end of said prestress layer and said major first electroded face of said electroactive member; and
  a conductive sheet within said recess, said conductive sheet being in electrical contact with said first electroded major face of said electroactive member and said first conductor.

3. The switching system according to claim 2:
wherein said mounting member further comprises a flexible material within said recess in said plate, said flexible material being between said depressed surface and said conductive sheet.

4. The switching system according to claim 3, further comprising:
a voltage regulator having an input side and an output side;
  said input side of said voltage regulator being electrically connected to said first and second conductors;
  said output side of said voltage regulator being electrically connected to said signal transmission means.

5. The switching system according to claim 4, further comprising:
a diode having an anode and a cathode connected in parallel with said flextensional;
  said cathode of said diode being electrically connected to said first conductor and said input side of said voltage regulator;
  said anode of said diode being electrically connected to said second conductor and said input side of said voltage regulator;
  whereby said diode is connected in parallel with first and second electroded major faces of said first electroactive member.

6. The switching system according to claim 5, wherein said signal transmission means further comprises:
a tone generator subcircuit having an input side and an output side;
  said input side of said tone generator subcircuit being connected to said output side of said voltage regulator;
  said output side of said tone generator subcircuit being connected to said first radio frequency generator subcircuit.

7. The switching system according to claim 6, wherein said tone generator subcircuit comprises:
an oscillator array having an input side and an output side;
  said input side of said oscillator array being connected to said output side of said voltage regulator; and
a transistor having a grounded emitter and a base connected to said output side of said oscillator array;
and wherein said first radio frequency generator subcircuit comprises a resonant subcircuit having a first and a second junction;
  said first junction of said resonant subcircuit being connected to said voltage regulator;
  said second junction of said resonant subcircuit being connected to a collector of said transistor.

8. The switching system according to claim 7, wherein said first radio frequency generator subcircuit further comprises:
a radio frequency choke connected in series between said output side of said voltage regulator and said first junction of said resonant subcircuit.

9. The switching device according to claim 8, wherein said resonant subcircuit comprises:
a first capacitor having a first and a second plate; and an inductive loop of a third conductor having first and second ends;
  said first plate of said first capacitor being connected to said first end of said third conductor, thereby forming said first junction of said resonant subcircuit;
  said second plate of said first capacitor being connected to said second end of said third conductor, thereby forming said second junction of said resonant subcircuit.

10. The switching system according to claim 9, wherein said oscillator array further comprises an inverter array connected between said output side of said voltage regulator and said base of said transistor.

11. The switching system according to claim 10, wherein said radio frequency choke comprises an inductor.

12. The switching system according to claim 11, wherein said resonant subcircuit further comprises:
  a tuning jumper comprising a sixth conductor having first and second ends each connected to said third conductor;
    said tuning jumper being adapted to pivot at said first and second ends, thereby rotating relative to said third conductor.

13. The switching system according to claim 12, further comprising:
  second signal transmission means having a second radio frequency generator subcircuit tunable to a second frequency;
  wherein said first radio frequency generator subcircuit is tunable to a first frequency different from said second frequency of said second radio frequency generator subcircuit.

14. The switching device according to claim 13, wherein said first tone generator and said first radio frequency generator subcircuits comprise a at least one programmable integrated interface controller circuit.

15. The switching device according to claim 14, wherein said signal reception means further comprises:
  a first radio signal receiver for intercepting said first signal transmitted by said first radio frequency generator subcircuit and a second signal transmitted by said second radio frequency generator subcircuit; and
  decoding means electrically connected between said radio signal receiver and said switch for generating a switching signal in response to said first and second intercepted signals.

16. The switching device according to claim 15, wherein said decoding means further comprises:
  a memory for storage of one or more signal profiles; and
  comparator means for determining whether said first or second intercepted signal matches said one or more signal profiles in said memory;
  wherein said decoding means generates a switching signal in response to said first intercepted signal upon said comparator means determination that said first intercepted signal matches said one or more signal profiles in said memory;
  and wherein said decoding means does not generate a switching signal in response to said second intercepted signal upon said comparator means determination that said second intercepted signal does not match any of said one or more signal profiles in said memory;
  and wherein said switch is adapted to change from said first position to said second position in response to said switching signal generated by said decoding means.

17. The switching system according to claim 16, wherein said decoder means comprises:
  a microprocessor for differentiating between said first intercepted signal and said second intercepted signal.

18. The switching system according to claim 17, wherein said decoder means further comprises:
  storage means for entering one or more signal profiles into said memory.

19. The switching system according to claim 18, wherein said storage means further comprises:
  a second radio signal receiver for intercepting said first and second signals transmitted by said first and second radio frequency generator subcircuits.

20. A self-powered switching system comprising:
  an electroactive transducer having first and second ends, said electroactive transducer comprising;
    a first electroactive member having opposing first and second electroded major faces and first and second ends;
    a flexible substrate bonded to said second major face of said first electroactive member;
      said flexible substrate having first and second ends adjacent said first and second ends of said first electroactive member;
    wherein said electroactive transducer is adapted to deform from a first position to a second position upon application of a force to said electroactive transducer;
    and wherein said electroactive transducer is adapted to return to said first position from said second position upon release of said force from said electroactive transducer;
    and wherein upon said deformation and said return between said first and second positions, said electroactive transducer is adapted to generate an oscillating voltage potential between said first electroded major face and said second electroded major face;
  a mounting member for retaining said first end of said electroactive transducer;
    said mounting member comprising a plate adjacent said first end of said flexible substrate and said first major face of said first electroactive member;
    said mounting member comprising retaining means adjacent said first end of said flexible substrate and opposite said second major face of said first electroactive member;
  pressure application means for application of a force to said second end of said electroactive transducer, said pressure application means being adapted to apply a force sufficient to deform said electroactive transducer from said first position to said second position, thereby generating a first voltage potential;
  a first conductor electrically connected to said first electroded major face of said first electroactive member;
  a second conductor electrically connected to said second electroded major face of said first electroactive member;
  a rectifier electrically connected between said first and second conductors in parallel with said first and second electroded major faces of said electroactive transducer;
  a voltage regulator having an input side and an output side;
    said input side of said voltage regulator being electrically connected to an output side of said rectifier;
  first signal transmission means electrically connected to said output side of said voltage regulator;

said first signal transmission means comprising a first radio frequency generator subcircuit connected to an antenna;

signal reception means for receiving a first signal transmitted by said first signal transmission means;

said signal reception means being adapted to generate a second signal in response to said first signal transmitted by said first signal transmission means; and a switch having a first position and a second position;

said switch being in communication with said signal reception means;

said switch being adapted to change between said first position and said second position in response to said second signal.

21. The switching system according to claim 20, wherein said electroactive transducer is selected from the group comprising: piezoelectric transducers, ferroelectric transducers, unimorphs, bimorphs, monomorph benders, asymmetrically stress biased electroactive devices, prestressed electroactive devices, RAINBOW transducers, MOONIE transducers, and THUNDER actuators.

22. The switching system according to claim 20, wherein said pressure application means further comprises:

release means for removal of said force to said second end of said electroactive transducer, said release means being adapted to remove said force at said second position;

and wherein said flexible substrate comprises a metallic substrate having a restoring force adapted to return said electroactive transducer to said first position;

and wherein upon said removal of said force from said second end of said electroactive transducer, said restoring force of said metallic substrate returns said electroactive transducer through said first position to a third position and decayingly oscillates to said first position, thereby generating said oscillating voltage potential.

23. The switching system according to claim 20, further comprising:

second signal transmission means having a second radio frequency generator subcircuit tunable to a second frequency;

wherein said first radio frequency generator subcircuit is tunable to a first frequency different from said second frequency of said second radio frequency generator subcircuit.

24. The switching system according to claim 20, wherein said pressure application means is selected from the group comprising: manual pressure; rollers; pressure plates; toggles; hinges; knobs; sliders; ratchets; twisting mechanisms; release latches; spring loaded devices; foot pedals; game consoles; traffic activated devices; and seat activated devices.

25. The switching system according to claim 20, further comprising:

electrical energy storage means having a first and a second terminal;

said first terminal of said electrical energy storage means being electrically connected to the output side of said voltage regulator;

said second terminal of said electrical energy storage means being electrically connected to ground;

whereby said electrical energy storage means may store an electrical output of said voltage regulator.

26. The switching system according to claim 25, further comprising:

trigger means connected between said pressure application means and said first signal transmission means;

and wherein said electrical energy storage means is adapted to supplement said output electrical signal of said voltage regulator to said first signal transmission means.

27. The switching system according to claim 20, further comprising:

electrical energy storage means having a first and a second terminal;

said first terminal of said electrical energy storage means being electrically connected to the output side of said rectifier;

said second terminal of said electrical energy storage means being electrically connected to ground;

whereby said electrical energy storage means may store an electrical output of said rectifier.

28. The switching system according to claim 27, wherein said electrical energy storage means further comprises:

at least one rechargeable battery.

29. The switching system according to claim 20, wherein said signal transmission means further comprises:

a tone generator subcircuit having an input side and an output side;

said input side of said tone generator subcircuit being connected to said output side of said voltage regulator;

said output side of said tone generator subcircuit being connected to said first radio frequency generator subcircuit.

30. The switching system according to claim 29, wherein said tone generator subcircuit comprises:

an oscillator array having an input side and an output side;

said input side of said oscillator array being connected to said output side of said voltage regulator;

a transistor having a grounded emitter and a base connected to said output side of said oscillator array; and an inductive loop of a third conductor having first and second ends;

wherein said first radio frequency generator subcircuit comprises a resonant subcircuit having a first and a second junction;

said resonant subcircuit having a first capacitor having a first plate and a second plate;

said first plate of said first capacitor being connected to said first end of said third conductor, thereby forming said first junction of said resonant subcircuit;

said second plate of said first capacitor being connected to said second end of said third conductor, thereby forming said second junction of said resonant subcircuit;

said first junction of said resonant subcircuit being connected to said output side of said voltage regulator;

said second junction of said resonant subcircuit being connected to a collector of said transistor;

and wherein said first radio frequency generator subcircuit further comprises an inductor connected in series between said output side of said voltage regulator and said first junction of said resonant subcircuit.

31. The switching system according to claim 30, wherein said oscillator array further comprises an inverter array connected between said output side of said voltage regulator and said base of said transistor.

32. The switching system according to claim 29, wherein said first tone generator and said first radio frequency generator subcircuits comprise a at least one programmable encoder circuit.

33. The switching system according to claim 20, wherein said signal reception means further comprises:
   a first radio signal receiver for intercepting said first signal transmitted by said first radio frequency generator subcircuit and a second signal transmitted by a second radio frequency generator subcircuit; and
   decoding means electrically connected between said radio signal receiver and said switch for generating a switching signal in response to said first and second intercepted signals.

34. The switching system according to claim 33, wherein said decoding means further comprises:
   a memory for storage of one or more signal profiles; and
   comparator means for determining whether said first or second intercepted signal matches said one or more signal profiles in said memory;
   wherein said decoding means generates a switching signal in response to said first intercepted signal upon said comparator means' determination that said first intercepted signal matches said one or more signal profiles in said memory;
   and wherein said decoding means does not generate a switching signal in response to said second intercepted signal upon said comparator means' determination that said second intercepted signal does not match any of said one or more signal profiles in said memory;
   and wherein said switch is adapted to change from said first position to said second position in response to said switching signal generated by said decoding means.

35. The switching system according to claim 34, wherein said decoder means comprises:
   a microprocessor for differentiating between said first intercepted signal and said second intercepted signal; and;
   storage means for entering one or more signal profiles into said memory.

36. The switching system according to claim 35, wherein said storage means further comprises:
   a second radio signal receiver for intercepting a third signal transmitted by a third radio frequency generator subcircuit.

37. A self-powered switching system, comprising:
   an electroactive transducer having first and second ends, said electroactive transducer comprising;
      a first electroactive member having opposing first and second electroded major faces and first and second ends;
      a flexible substrate bonded to said second major face of said first electroactive member;
         said flexible substrate having first and second ends adjacent said first and second ends of said first electroactive member;
      wherein said electroactive transducer is adapted to deform from a first position to a second position upon application of a force to said electroactive transducer;
      and wherein said electroactive transducer is adapted to return to said first position from said second position upon release of said force from said electroactive transducer;
      and wherein upon said deformation from said first position to second position, said electroactive transducer is adapted to generate a first voltage potential between said first electroded major face and said second electroded major face;
      and wherein upon said return from said first position to second position, said electroactive transducer is adapted to generate a second voltage potential between said first electroded major face and said second electroded major face;
   a mounting member for retaining said first end, said second end or said first and second ends of said electroactive transducer;
      said mounting member comprising at least one retaining means adjacent said first end, said second end or said first and second ends of said flexible substrate of said first electroactive member;
   pressure application means for application of a force to said first end, said second end or between said first and second ends of said electroactive transducer, said pressure application means being adapted to apply a force sufficient to deform said electroactive transducer from said first position to said second position, thereby generating a first voltage potential;
   a first conductor electrically connected to said first electroded major face of said first electroactive member;
   a second conductor electrically connected to said second electroded major face of said first electroactive member;
   a rectifier electrically connected between said first and second conductors in parallel with said first and second electroded major faces of said electroactive transducer;
   a voltage regulator having an input side and an output side;
      said input side of said voltage regulator being electrically connected to an output side of said rectifier;
   first signal transmission means electrically connected to said output side of said voltage regulator;
      said first signal transmission means comprising a first radio frequency generator subcircuit connected to an antenna;
   electrical energy storage means having a first and a second terminal;
      said first terminal of said electrical energy storage means being electrically connected to the output side of said voltage regulator;
      said second terminal of said electrical energy storage means being electrically connected to ground;
   whereby said electrical energy storage means may store an electrical output of said voltage regulator;
   and wherein said electrical energy storage means is adapted to supplement said electrical output of said voltage regulator to said first signal transmission means with said stored output electrical signal of said voltage regulator;
   signal reception means for receiving a first signal transmitted by said first signal transmission means;
      said signal reception means being adapted to generate a second signal in response to said first signal transmitted by said first signal transmission means; and
   a switch having a first position and a second position;
      said switch being in communication with said signal reception means;
      said switch being adapted to change between said first position and said second position in response to said second signal.

38. A self-powered switching system, comprising:
an electroactive transducer having first and second ends, said electroactive transducer comprising;
   a first electroactive member having opposing first and second electroded major faces and first and second ends;
   a flexible substrate bonded to said second major face of said first electroactive member;
      said flexible substrate having first and second ends adjacent said first and second ends of said first electroactive member;
   wherein said electroactive transducer is adapted to deform from a first position to a second position upon application of a force to said electroactive transducer;
   and wherein said electroactive transducer is adapted to return to said first position from said second position upon release of said force from said electroactive transducer;
   and wherein upon said deformation from said first position to second position, said electroactive transducer is adapted to generate a first voltage potential between said first electroded major face and said second electroded major face;
   and wherein upon said return from said first position to second position, said electroactive transducer is adapted to generate a second voltage potential between said first electroded major face and said second electroded major face;
a mounting member for retaining said first end, said second end or said first and second ends of said electroactive transducer;
   said mounting member comprising at least one retaining means adjacent said first end, said second end or said first and second ends of said flexible substrate of said first electroactive member;
pressure application means for application of a force to said first end, said second end or between said first and second ends of said electroactive transducer, said pressure application means being adapted to apply a force sufficient to deform said electroactive transducer from said first position to said second position, thereby generating a first voltage potential;
a first conductor electrically connected to said first electroded major face of said first electroactive member;
a second conductor electrically connected to said second electroded major face of said first electroactive member;
a rectifier electrically connected between said first and second conductors in parallel with said first and second electroded major faces of said electroactive transducer;
a voltage regulator having an input side and an output side;
   said input side of said voltage regulator being electrically connected to an output side of said rectifier;
first signal transmission means electrically connected to said output side of said voltage regulator;
   said first signal transmission means comprising a first radio frequency generator subcircuit connected to an antenna;
electrical energy storage means having a first and a second terminal;
   said first terminal of said electrical energy storage means being electrically connected to the output side of said rectifier;
   said second terminal of said electrical energy storage means being electrically connected to ground;
   whereby said electrical energy storage means may store an electrical output of said rectifier;
   and wherein said electrical energy storage means is adapted to supplement said electrical output of said voltage regulator to said first signal transmission means with said stored output electrical signal of said voltage regulator;
signal reception means for receiving a first signal transmitted by said first signal transmission means;
   said signal reception means being adapted to generate a second signal in response to said first signal transmitted by said first signal transmission means; and
a switch having a first position and a second position;
   said switch being in communication with said signal reception means;
   said switch being adapted to change between said first position and said second position in response to said second signal.

39. The switching system according to claim 38, wherein said electrical energy storage means further comprises:
at least one rechargeable battery.

40. A switching system, comprising:
electromechanical generation means for generating an oscillating voltage across first and second electrical terminals;
a rectifier electrically connected between said first and second electrical terminals;
a voltage regulator having an input side and an output side;
   said input side of said voltage regulator being electrically connected to an output side of said rectifier;
first signal transmission means electrically connected to said output side of said voltage regulator;
   said first signal transmission means comprising a first electromagnetic signal generator subcircuit connected to transmitter;
signal reception means for receiving a first electromagnetic signal transmitted by said first signal transmission means;
   said signal reception means being adapted to generate a second signal in response to said first electromagnetic signal transmitted by said first signal transmission means; and
a switch having a first position and a second position;
   said switch being in communication with said signal reception means;
   said switch being adapted to change between said first position and said second position in response to said second signal.

41. The switching system according to claim 40, wherein said electromechanical generation means is selected from the group comprising: piezoelectric transducers, ferroelectric transducers, unimorphs, bimorphs, monomorph benders, asymmetrically stress biased electroactive devices, pre-stressed electroactive devices, RAINBOW transducers, MOONIE transducers, THUNDER actuators; rotary magnetic generators; and
linear magnetic generators.

42. The switching system according to claim 40, wherein said first signal transmission means comprises:
a first radio frequency generator subcircuit connected to an antenna; and
a tone generator subcircuit having an input side and an output side;

said input side of said tone generator subcircuit being connected to said output side of said voltage regulator;

said output side of said tone generator subcircuit being connected to said first radio frequency generator subcircuit.

43. The switching system according to claim 40, further comprising:

electrical energy storage means having a first and a second terminal;

said first terminal of said electrical energy storage means being electrically connected to the output side of said voltage regulator;

said second terminal of said electrical energy storage means being electrically connected to ground;

whereby said electrical energy storage means may store an electrical output of said voltage regulator;

and wherein said electrical energy storage means is adapted to supplement said electrical output of said voltage regulator to said first signal transmission means with said stored output electrical signal of said voltage regulator.

44. The switching system according to claim 43, wherein said electrical energy storage means further comprises:

at least one rechargeable battery.

45. The switching system according to claim 40, further comprising:

electrical energy storage means having a first and a second terminal;

said first terminal of said electrical energy storage means being electrically connected to the output side of said rectifier;

said second terminal of said electrical energy storage means being electrically connected to ground;

whereby said electrical energy storage means may store an electrical output of said rectifier;

and wherein said electrical energy storage means is adapted to supplement said electrical output of said voltage regulator to said first signal transmission means with said stored output electrical signal of said rectifier.

46. The switching system according to claim 45, wherein said electrical energy storage means further comprises:

at least one rechargeable battery.

47. The switching system according to claim 40, wherein said first tone generator and said first radio frequency generator subcircuits comprise a at least one programmable encoder circuit;

and wherein each of said first programmable encoder circuits is adapted to be programmed to generate one or more unique codes;

and wherein each of said unique codes generated by each of said first programmable encoder circuits is different from each of said unique codes generated by the others of said first programmable encoder circuits.

48. The switching system according to claim 47, further comprising:

second signal transmission means comprising a second at least one programmable encoder circuit connected to an antenna;

each of said second programmable encoder circuits comprising a radio frequency generator subcircuit and a tone generator subcircuit;

wherein each of said second programmable encoder circuits is adapted to be programmed to generate one or more unique codes;

and wherein each of said unique codes generated by each of said second programmable encoder circuits is different from each of said unique codes generated by each of said first programmable encoder circuits, and different from each of said unique codes generated by the others of said second programmable encoder circuits.

49. The switching system according to claim 48, wherein said unique codes comprise operation codes selected from the group comprising: identification; toggle; on; off; dim; undim; operate; and a percentage of operating mode.

50. The switching system according to claim 48, wherein said one or more unique codes programmed into said first or second programmable encoder circuits are not changeable after initial programming of said one or more unique codes.

51. The switching system according to claim 48, wherein said one or more unique codes programmed into said first or second programmable encoder circuits are binary codes.

52. The switching system according to claim 48, where said signal reception means further comprises:

a first radio signal receiver for intercepting a code transmitted by said first or second signal transmission means;

decoding means electrically connected between said radio signal receiver and said switch for generating a switching signal in response to said first and second intercepted codes.

53. The switching system according to claim 52, wherein said decoding means further comprises:

a memory for storage of one or more signal profiles; and comparator means for determining whether said first or second intercepted codes matches said one or more signal profiles in said memory;

wherein said decoding means generates a switching signal in response to said first intercepted code upon said comparator means determination that said first intercepted code matches said one or more signal profiles in said memory;

and wherein said decoding means does not generate a switching signal in response to said second intercepted code upon said comparator means determination that said second intercepted code does not match any of said one or more signal profiles in said memory;

and wherein said switch is adapted to change from said first position to said second position in response to said switching signal generated by said decoding means.

54. The switching system according to claim 53, wherein said decoding means comprises:

a microprocessor for differentiating between said first intercepted code and said second intercepted code; and;

storage means for entering one or more signal profiles into said memory.

55. The switching system according to claim 53, wherein said one or more signal profiles are selected from the group comprising: identification; toggle; on; off; dim; undim; operate; and a percentage of operating mode.

56. The switching system according to claim 53, wherein said signal reception means further comprises:

a signal relay transmitter for transmission of an actuation signal upon receipt of said switching signal generated by said decoding means; and a second switch adapted to change from a first position to a second position in response to said actuation signal from said signal relay transmitter.

57. The switching system according to claim 53, further comprising:

a programming jumper having first and second ends for transmission of said unique codes from said signal transmission means to said memory for storage of said one or more signal profiles;

and wherein said signal transmission means comprises a transmitter jumper connection for connection of said first programmable encoder circuit to said first end of said programming jumper;

and wherein said signal reception means comprises a receiver jumper connection for connection of said memory to said second end of said programming jumper.

58. A self-powered switching system, comprising:

an electromechanical generator for generating a voltage across first and second electrical terminals;

a voltage regulator having an input side and an output side;

said input side of said voltage regulator being electrically connected to said first and second electrical terminals;

first signal transmission means electrically connected to said output side of said voltage regulator;

said first signal transmission means comprising a first electromagnetic signal generator subcircuit connected to a transmitter; and a first tone generator subcircuit having an input side and an output side;

said input side of said tone generator subcircuit being connected to said output side of said voltage regulator;

said output side of said tone generator subcircuit being connected to said first electromagnetic signal generator subcircuit;

wherein said first tone generator and said first electromagnetic signal generator subcircuits comprise at least one programmable encoder circuit;

and wherein each of said first programmable encoder circuits is adapted to be programmed to generate one or more unique codes;

and wherein each of said unique codes generated by each of said first programmable encoder circuits is different from each of said unique codes generated by the others of said first programmable encoder circuits;

signal reception means for receiving a first electromagnetic signal transmitted by said first signal transmission means;

said signal reception means being adapted to generate a second signal in response to said first electromagnetic signal transmitted by said first signal transmission means; and a switch having a first position and a second position;

said switch being in communication with said signal reception means;

said switch being adapted to change between said first position and said second position in response to said second signal.

59. The switching system according to claim 58, further comprising:

second signal transmission means comprising a second at least one programmable encoder circuit connected to an antenna;

each of said second programmable encoder circuits comprising a second radio frequency generator subcircuit and a second tone generator subcircuit;

wherein each of said second programmable encoder circuits is adapted to be programmed to generate one or more unique codes;

and wherein each of said unique codes generated by each of said second programmable encoder circuits is different from each of said unique codes generated by each of said first programmable encoder circuits, and different from each of said unique codes generated by the others of said second programmable encoder circuits.

* * * * *